(12) United States Patent  (10) Patent No.: US 7,355,493 B2
Yanagisawa et al.  (45) Date of Patent: Apr. 8, 2008

(54) FILTER ELEMENT

(75) Inventors: Koichi Yanagisawa, Ueda (JP); Fuchun Zhang, Ueda (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 0 days.

(21) Appl. No.: 11/554,737

(22) Filed: Oct. 31, 2006

(65)  Prior Publication Data
US 2007/0057749 A1  Mar. 15, 2007

Related U.S. Application Data

(62) Division of application No. 10/921,988, filed on Aug. 20, 2004, now Pat. No. 7,148,768.

(30)  Foreign Application Priority Data

Aug. 21, 2003 (JP) ............................. 2003-208279
Nov. 5, 2003 (JP) ............................. 2003-375590
Dec. 26, 2003 (JP) ............................. 2003-432706

(51) Int. Cl.
  *H03H 7/01* (2006.01)
(52) U.S. Cl. ...................................... 333/184; 333/185
(58) Field of Classification Search ............... 333/181, 333/184, 185; 361/303, 313
See application file for complete search history.

(56) References Cited

U.S. PATENT DOCUMENTS

| 4,945,322 A | 7/1990 | Okumura |
| 4,983,934 A * | 1/1991 | Okumura .................... 333/184 |
| 5,030,933 A | 7/1991 | Ikeda |

(Continued)

FOREIGN PATENT DOCUMENTS

JP  63-174416  7/1988

(Continued)

OTHER PUBLICATIONS

English language Abstract of JP 63-174416.

(Continued)

*Primary Examiner*—Seungsook Ham
(74) *Attorney, Agent, or Firm*—Greenblum & Bernstein, P.L.C.

(57) ABSTRACT

A filter element includes a coil part formed in an overall tubular shape by layering a pair of signal transmitting belt-shaped conductors and a grounding belt-shaped conductor with a belt-shaped insulator in between and winding so that the grounding belt-shaped conductor is outside a pair of signal transmitting belt-shaped conductors, a magnetic body attached to a center of the coil part; a pair of input terminals that are connected to respective outermost circumferential parts of the pair of signal transmitting belt-shaped conductors and are respectively led from outer circumferential positions of the coil part; a pair of output terminals that are connected to respective innermost circumferential parts of the pair of signal transmitting belt-shaped conductors and are respectively led from central positions of the coil part located on an opposite side to leading positions of the pair of input terminals with the magnetic body in between; and a grounding terminal that is connected to an outermost circumferential part of the grounding belt-shaped conductor and is led from an outer circumferential position of the coil part located on an opposite side to the leading positions of the pair of input terminals with leading positions of the pair of output terminals in between.

20 Claims, 26 Drawing Sheets

U.S. PATENT DOCUMENTS 5,040,094 A   8/1991   Okumura
5,153,812 A   10/1992  Naito

FOREIGN PATENT DOCUMENTS

| JP | 02-026114 | 1/1990 |
| JP | 02-026115 | 1/1990 |
| JP | 08065081 A * | 3/1996 |
| JP | 2 826320 B | 9/1998 |

OTHER PUBLICATIONS

English language Abstract of JP 02-026114.
English language Abstract of JP 02-026115.

* cited by examiner

F I G. 1 5
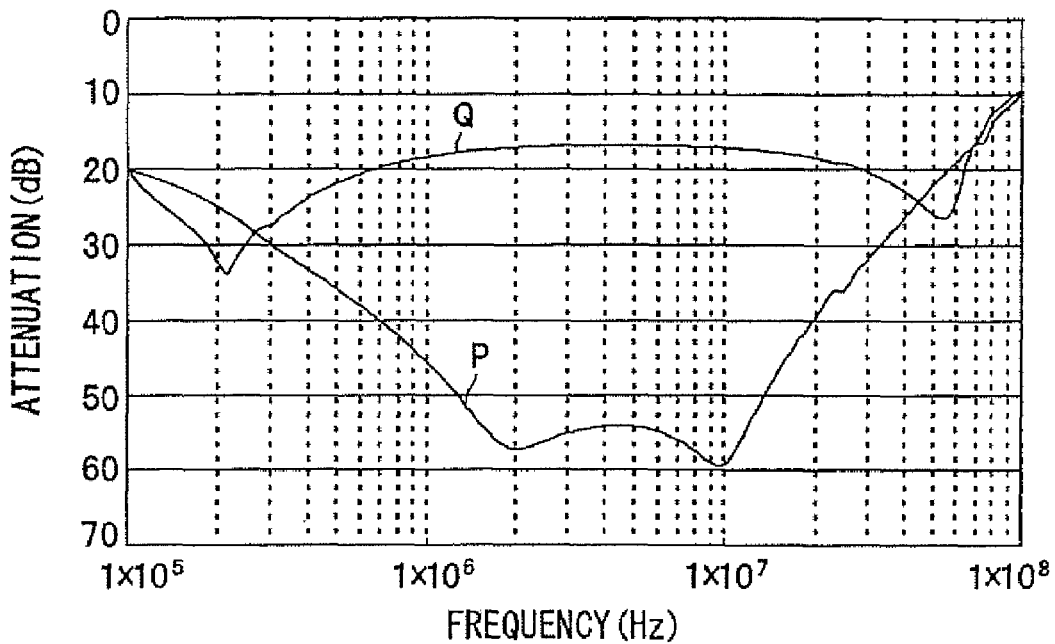
F I G. 1 6
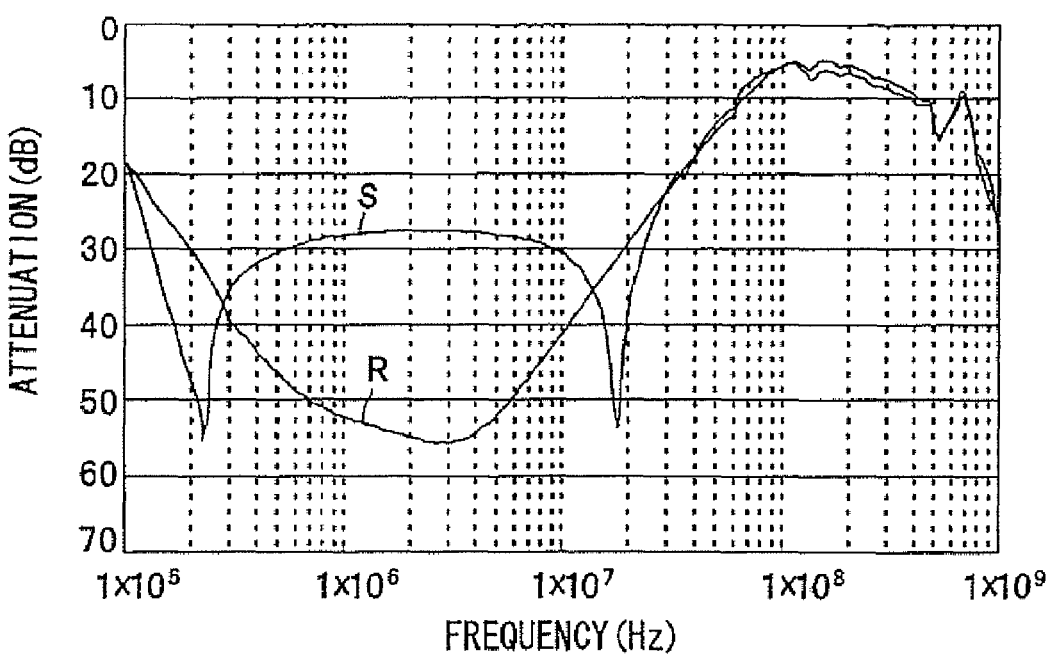

OUTER INPUT/INNER OUTPUT

INNER INPUT/OUTER OUTPUT

FILTER ELEMENT

CROSS-REFERENCE TO RELATED APPLICATIONS

This application is a divisional of U.S. patent application Ser. No. 10/921,988 filed on Aug. 20, 2004 now U.S. Pat. No. 7,148,768, the contents of which are expressly incorporated by reference in its entirety.

BACKGROUND OF THE INVENTION

1. Field of the Invention

The present invention relates to a spiral multilayer-type filter element constructed by winding a belt-like (i.e. belt-shape) conductor that has been placed on a belt-like insulator.

2. Description of the Related Art

As examples of this type of filter element, filter elements disclosed as a comparative example and an embodiment in Japanese Patent No. 2,826,320 are known. These filter elements are formed by winding a plurality of belt-like conductors (belt-like conductors for conducting and connecting to ground), via a dielectric sheet with high dielectric constant, around a magnetic or non-magnetic spool or an air core, and function as three-terminal noise filters (normal mode noise filters). In these filter elements, an inductance is formed between a pair of leads connected to a winding start part and a winding end part of the belt-like conductor for conducting, and a capacitance that is distributed constant is also formed between the belt-like conductor for conducting and the belt-like conductor for grounding along the entire length of the belt-like conductor for conducting. With these filter elements, it is therefore possible to realize superior conductor for grounding along the entire length of the belt-like conductor for conducting. With these filter elements, it is therefore possible to realize superior attenuation characteristics across a wide bandwidth.

out of these filter elements, as shown in FIG. 1(A) of the reference, the filter element (hereinafter also simplified to "filter") disclosed as a comparative example includes a tube-like wound part and three leads that are provided on one end surface of the wound part. In this case, the wound part is formed by winding a multilayer structure (see FIG. 2 of the reference), in which a belt-like conductor and a grounding belt-like conductor are placed on top of one another with two dielectric layers in between, a plurality of times around a rotating winding shaft. On the other hand, a first inner lead for inputting and outputting is connected to a periphery of an inner end (the left end in FIG. 2) of the belt-like conductor. A first outer lead for inputting and outputting is connected to an outer periphery of the belt-like conductor. In addition, a grounding outer lead is connected to a periphery of an outer end of the grounding belt-like conductor so as to be displaced by a ½ turn about the winding axis from the first outer lead.

With this construction, in the filter, the gap between both leads can be sufficiently narrowed in a state where the conductors are unwound, so that superior attenuation characteristics can be realized. Also, in this filter, since it is possible to position both leads a predetermined distance apart on a substantially straight line that passes through the center of the winding axis, superior mass-producibility and substantially uniform and favorable attenuation characteristics can be realized. Also, as shown in FIG. 1(B) of the same reference, by heating the tube-like wound part in a state where the winding shaft has been removed and simultaneously pressing the wound part from a direction perpendicular to wires connected to the two leads, it is possible to achieved the same effect in a construction where the air core part and wound part have deformed into a flattened shape.

On the other hand, as shown by FIG. 4 of the reference, the filter element disclosed as an embodiment includes a tube-like wound part and three leads provided on one end surface of the cylindrical wound part, with the grounding outer lead being disposed at a position displaced by one half turn about the winding axis with respect to the first outer lead (that is, the first outer lead, the grounding lead and the center of the winding axis being disposed on a straight line) in the same way as the filter element of the comparative example described above. On the other hand, the filter element disclosed as the embodiment differs to the filter element of the comparative example described above in that the first inner lead is disposed so as to be displaced by one quarter turn about the winding center axis with respect to the first outer lead (that is, the first inner lead is disposed on a straight line that passes through the center of the winding axis and is perpendicular to the above straight line).

With this construction, in the filter element disclosed as the embodiment, it is possible to sufficiently narrow the distance between the two leads in a state where the conductors are unwound, so that superior attenuation characteristics can be realized. In addition, when the wound part of the filter element is deformed into a flattened shape, it is possible to position the first inner lead at substantially the same position as the center of the winding axis, and as a result it is possible to dispose the grounding lead and the first outer lead with left-right symmetry about the winding axis, that is, about the first inner lead. Since sufficient physical gaps are obtained between the first outer lead and the first inner lead and between the first inner lead and the grounding lead, it is possible to effectively avoid short circuits inadvertently caused during operations such as wiring and soldering. The filter element can therefore easily be attached to a printed circuit board.

However, an air-core device of this type has little effect on low frequency noise, such as noise produced by a switching power supply. Also, there have been demands for a filter element that has more superior attenuation characteristics. In order to satisfy such demand, the inventors of the present embodiment conducted original research into this kind of filter element, and by using a special arrangement for the respective leads, discovered that a filter element with even more superior attenuation characteristics can be realized.

The main application of this kind of filter element, in other words, a spiral multilayer filter element where a signal transmitting line and a grounding line that are both formed in belt shapes are wound in a spiral with a tape-like insulator in between, is the eradication of power supply noise caused by a switching regulator or the like, but aside from this, operation as a transformer was also verified.

In a spiral multilayer filter element, the signal transmitting line is held within the grounding line with the insulator in between, so that the signal transmitting line and the grounding line are magnetically coupled to one another and have a large distributed inductance. When the grounding line is examined, however, at the opposite end to the grounded point, an inductive impedance is present on the path to the grounded point due to distributed impedance of grounding line itself, and as a result, the ground potential (0V) is not necessarily achieved along the entire length of the grounding line.

In this way, since the potentials of the parts of the grounding line present on both sides of the signal transmission line are asymmetrical, the operation of the spiral multilayer filter element is extremely complex, but the arrangement of the lead terminals can be given as one factor influencing the performance and characteristics of the filter element.

That is, when a signal transmitting line and grounding line are wound with an insulator in between, a signal input lead terminal and a signal output lead terminal are connected at both ends of the signal transmitting line and one end of the grounding line is connected to the grounding lead terminal, with the positions of the three lead terminals after winding having a large influence on the performance and characteristics of the filter.

To obtain superior attenuation characteristics across a wide bandwidth, the three lead terminals, that is, the signal input lead terminal, the signal output lead terminal, and the grounding terminal, need to be aligned on a straight line with predetermined gaps in between. However, it is extremely difficult to wind the signal transmitting line and the grounding line so that the three lead terminals are aligned on the same straight line.

For this reason, in the three-terminal noise filter disclosed in Japanese Patent No. 2,826,320, when the belt-like conductor (signal transmitting line), to which the first inner lead and the first outer lead for inputting and outputting are connected at peripheries of both ends, and the grounding belt-like conductor (grounding line), to which a grounding outer lead is connected at an outer end periphery, are wound with an insulator sheet in between, the first inner lead and the first outer lead are displaced by one quarter turn, and the first outer lead and the grounding outer lead are brought close to one another in the circuit layout in a state where the leads are substantially one half-turn apart. In addition, by pressing and flattening the wound multilayer structure from a direction perpendicular to a straight line that joins the respective outer leads, the three leads can be placed on a straight line with substantially equal gaps in between.

However, since the positions of the three leads are fixed in the filter disclosed in the above reference, in a circuit board on which the filter is mounted, there are limitations on the design in that through-holes, peripheral components, and the like have to be designed in accordance with the lead positions of the filter.

This kind of filter acts as a normal mode noise filter when there is one signal transmitting line and as a common mode noise filter when there are two (or more) signal transmitting lines, but in either case, if the filter has an air core like the filters disclosed in the reference, it is not possible to obtain a high attenuation effect for low frequency noise in particular.

In a case where the filter element is used as a common mode noise filter for a switching frequency of around several tens to several hundred kHz, such as with a switching power supply, to achieve a sufficient noise suppressing effect, it is necessary to reinforce the magnetic coupling between the respective signal transmitting lines using a magnetic body.

To do so, as the above magnetic body, it is possible to use a pot-type magnetic core or the like that is made of ferrite and includes a center core disposed at a center of a multilayer coil, but the leading of lead terminals from the magnetic core thereof is problematic.

That is, although lead holes and the like are formed in the magnetic core in accordance with the positions of the three lead terminals connected to the multilayer coil, in the actual assembly process, slight positional displacements occur. Also, when ferrite is used as the magnetic body, the ferrite is brittle and so difficult to machine, which means that depending on the positions at which holes and the like are formed, there are cases where the core breaks during the machining process.

Accordingly, in a spiral multilayer filter element, when additionally using a magnetic core that improves the attenuation characteristics for low-frequency noise, there is the problem of how to lead the three lead terminals that are connected to the coil from the predetermined positions to the outside of the magnetic core in accordance with the form of the magnetic core.

In addition, the filter disclosed in the above reference functions as a three-terminal noise filter (a normal mode noise filter) that has three leads, but there is demand for the realization of a spiral multilayer filter element that is a common mode filter element. For this reason, as shown in FIG. 33, the inventors of the present invention fabricated a common mode filter element 1001 by using two conducting belt-like conductors (signal transmitting belt-like conductors) 9a, 9b, disposing the respective signal transmitting belt-like conductors 9a, 9b in parallel on a belt-like conductor (grounding belt-like conductor) 8 for grounding with a belt-like insulator 7b in between, arranging the belt-like conductors 9a, 9b in parallel in the width direction of the grounding belt-like conductor 8, and winding these component parts together. However, in the filter element 1001 of this construction, when the noise attenuation characteristics (as one example the power supply terminal interference voltage characteristics) were measured, it was difficult to achieve satisfactory characteristics. For this reason, there is the problem of how to realize a spiral multilayer common mode filter element with favorable noise attenuation characteristics.

SUMMARY OF THE INVENTION

The present invention was conceived in view of the above demands and it is a first object of the present invention to provide a filter element that has superior attenuation characteristics. It is a second object to provide a filter element that when used with a magnetic core enables three lead terminals connected to the coil part to be lead out of the magnetic core from predetermined positions in accordance with the form of the magnetic core. In addition, it is a third object to provide a spirally layered common mode filter element with favorable noise attenuation characteristics.

To achieve the stated first object, a filter element according to the present invention includes: a coil part formed in an overall tube-like shape by layering a signal transmitting belt-like conductor and a grounding belt-like conductor with a belt-like insulator in between and winding so that the grounding belt-like conductor is outside the signal transmitting belt-like conductor, a magnetic body being attached to a center of the coil part; an input terminal that is connected to an outermost circumferential part of the signal transmitting belt-like conductor and is led from an outer circumferential position of the coil part; an output terminal that is connected to an innermost circumferential part of the signal transmitting belt-like conductor and is led from a central position of the coil part located on an opposite side to a leading position of the input terminal with the magnetic body in between; and a grounding terminal that is connected to an outermost circumferential part of the grounding belt-like conductor and is led from an outer circumferential position of the coil part located on an opposite side to a leading position of the input terminal with a leading position of the output terminal in between. Here, a "belt-like conductor" for the present invention is not limited to a sheet-like conductor with little thickness but also includes conductors with a certain amount of thickness, such as flexible plate-like conductors that are circular, oval, rectangular, or trapezoidal in cross section.

According to the above construction, the filter element includes a coil part that is formed in an overall tube-like shape by winding so that the grounding belt-like conductor is outside the signal transmitting belt-like conductor with a magnetic body being attached to a center of the coil part, an input terminal that is connected to an outermost circumferential part of the signal transmitting belt-like conductor and is led from the coil part, an output terminal that is connected to an innermost circumferential part of the signal transmitting belt-like conductor and is led from a central position of the coil part located on an opposite side to a leading position of the input terminal with the magnetic body in between, and a grounding terminal that is connected to an outermost circumferential part of the grounding belt-like conductor and is led from an outer circumferential position of the coil part located on an opposite side to a leading position of the input terminal with a leading position of the output terminal in between, and since it is possible to achieve a large attenuation for a predetermined bandwidth, it is possible to realize a normal mode filter element with superior attenuation characteristics.

Another filter element according to the present invention includes: a coil part formed in an overall tube-like shape by layering a signal transmitting belt-like conductor and a grounding belt-like conductor with a belt-like insulator in between and winding so that the signal transmitting belt-like conductor is outside the grounding belt-like conductor, a magnetic body being attached to a center of the coil part; an input terminal that is connected to an innermost circumferential part of the signal transmitting belt-like conductor and is led from a central position of the coil part; a grounding terminal that is connected to an innermost circumferential part of the grounding belt-like conductor and is led from a central position of the coil part located on an opposite side to a leading position of the input terminal with the magnetic body in between; and an output terminal that is connected to an outermost circumferential part of the signal transmitting belt-like conductor and is led from an outer circumferential position of the coil part located on an opposite side to the leading position of the input terminal with a leading position of the grounding terminal in between.

According to the above construction, the filter element includes a coil part formed in an overall tube-like shape by winding so that the signal transmitting belt-like conductor is outside the grounding belt-like conductor with a magnetic body being attached to a center of the coil part, an input terminal that is connected to an innermost circumferential part of the signal transmitting belt-like conductor and is led from the coil part, a grounding terminal that is connected to an innermost circumferential part of the grounding belt-like conductor and is led from a central position of the coil part located on an opposite side to a leading position of the input terminal with the magnetic body in between, and an output terminal that is connected to an outermost circumferential part of the signal transmitting belt-like conductor and is led from an outer circumferential position of the coil part located on an opposite side to the leading position of the input terminal with a leading position of the grounding terminal in between, and since it is possible to achieve a large attenuation for a predetermined bandwidth, it is possible to realize a normal mode filter element with superior attenuation characteristics.

Another filter element according to the present invention includes: a coil part formed in an overall tube-like shape by layering a pair of signal transmitting belt-like conductors and a grounding belt-like conductor with a belt-like insulator in between and winding so that the grounding belt-like conductor is outside the pair of signal transmitting belt-like conductors, a magnetic body being attached to a center of the coil part; a pair of input terminals that are connected to respective outermost circumferential parts of the pair of signal transmitting belt-like conductors and are respectively led from outer circumferential positions of the coil part; a pair of output terminals that are connected to respective innermost circumferential parts of the pair of signal transmitting belt-like conductors and are respectively led from central positions of the coil part located on an opposite side to leading positions of the pair of input terminals with the magnetic body in between; and a grounding terminal that is connected to an outermost circumferential part of the grounding belt-like conductor and is led from an outer circumferential position of the coil part located on an opposite side to leading positions of the pair of input terminals with leading positions of the pair of output terminals in between.

According to the above construction, the filter element includes a coil part formed in an overall tube-like shape by winding so that the grounding belt-like conductor is outside the pair of signal transmitting belt-like conductors, a magnetic body being attached to a center of the coil part, a pair of input terminals that are connected to respective outermost circumferential parts of the pair of signal transmitting belt-like conductors and are respectively led from the coil part, a pair of output terminals that are connected to respective innermost circumferential parts of the pair of signal transmitting belt-like conductors and are respectively led from central positions of the coil part located on an opposite side to leading positions of the pair of input terminals with the magnetic body in between, and a grounding terminal that is connected to an outermost circumferential part of the grounding belt-like conductor and is led from an outer circumferential position of the coil part located on an opposite side to leading positions of the pair of input terminals with leading positions of the pair of output terminals in between, and since it is possible to achieve a large attenuation for a predetermined bandwidth, it is possible to realize a common mode filter element with superior attenuation characteristics.

Another filter element according to the present invention includes: a coil part formed in an overall tube-like shape by layering a pair of signal transmitting belt-like conductors and a grounding belt-like conductor with a belt-like insulator in between and winding so that the pair of signal transmitting belt-like conductors are outside the grounding belt-like conductor, a magnetic body being attached to a center of the coil part; a pair of input terminals that are connected to respective innermost circumferential parts of the pair of signal Transmitting belt-like conductors and are respectively led from central positions of the coil part; a grounding terminal that is connected to an innermost circumferential part of the grounding belt-like conductor and is led from a central position of the coil part located on an opposite side to leading positions of the pair of input terminals with the magnetic body in between; and a pair of output terminals that are connected to respective outermost circumferential parts of the pair of signal transmitting belt-like conductors and are respectively led from outer circumferential positions of the coil part located on an opposite side to the leading positions of the pair of input terminals with a leading position of the grounding terminal in between.

According to the above construction, the filter element includes a coil part formed in an overall tube-like shape by winding so that the pair of signal transmitting belt-like conductors are outside the grounding belt-like conductor, a magnetic body being attached to a center of the coil part, a pair of input terminals that are connected to respective innermost circumferential parts of the pair of signal transmitting belt-like conductors and are respectively led from the coil part, a grounding terminal that is connected to an innermost circumferential part of the grounding belt-like conductor and is led from a central position of the coil part located on an opposite side to leading positions of the pair of input terminals with the magnetic body in between, and a pair of output terminals that are connected to respective outermost circumferential parts of the pair of signal transmitting belt-like conductors and are respectively led from outer circumferential positions of the coil part located on an opposite side to the leading positions of the pair of input terminals with a leading position of the grounding terminal in between, and since it is possible to achieve a large attenuation for a predetermined bandwidth, it is possible to realize a common mode filter element with superior attenuation characteristics.

In the case of the above filter elements, the leading positions of the input terminals, the leading positions of the output terminals, and the leading positions of the grounding terminals can be positioned on a single plane including a central axis of the coil part. By doing so, since it is possible to achieve an even larger attenuation for a predetermined bandwidth, it is possible to realize a normal mode or common mode filter element with more superior attenuation characteristics.

To achieve the stated second object, a filter element according to the present invention includes: a coil part where a signal transmitting belt-like conductor and a grounding belt-like conductor are wound in a spiral with a belt-like insulator in between so that the grounding belt-like conductor is outside the signal transmitting belt-like conductor; and a magnetic core that includes a center core which is passed through a center of the coil part, that forms a magnetic circuit that interlinks the coil part, and includes at least two lead exit parts, a first lead exit part and a second lead exit part, provided at different positions, wherein an input terminal is connected to an outermost circumferential part of a part of the signal transmitting belt-like conductor that functions as a filter, an output terminal is connected to an innermost circumferential part of the part of the signal transmitting belt-like conductor that functions as a filter, the grounding belt-like conductor, which is adjacent to and inside an outermost circumferential part of the signal transmitting belt-like conductor, is extended within a range of one outer circumference from a connecting position of the input terminal, a grounding terminal is connected to a predetermined position on an extended part of the grounding belt-like conductor, and the input terminal is led from a first lead exit part and the grounding terminal is led from a second lead exit part.

According to this filter element, it is possible to locate the grounding terminal at a freely chosen position within substantially one revolution at the outermost circumference of the grounding belt-like conductor without deterioration in the performance and characteristics of the filter element. Accordingly, the freedom with which the grounding terminal can be led from the magnetic core can be greatly increased.

Another filter element according to the present invention includes: a coil part where a signal transmitting belt-like conductor and a grounding belt-like conductor are wound in a spiral with a belt-like insulator in between so that the signal transmitting belt-like conductor is outside the grounding belt-like conductor; and a magnetic core that includes a center core which is passed through a center of the coil part, that forms a magnetic circuit that interlinks the coil part, and includes at least two lead exit parts, a first lead exit part and a second lead exit part, provided at different positions, wherein an input terminal is connected to an innermost circumferential part of a part of the signal transmitting belt-like conductor that functions as a filter, an output terminal is connected to an outermost circumferential part of the part of the signal transmitting belt-like conductor that functions as a filter, the grounding belt-like conductor, which is adjacent to and outside an innermost circumferential part of the signal transmitting belt-like conductor, is extended within a range of one inner circumference from a connecting position of the input terminal, a grounding terminal is connected to a predetermined position on an extended part of the grounding belt-like conductor, and the input terminal is led from a first lead exit part and the grounding terminal is led from a second lead exit part.

According to this filter element, it is possible to locate the grounding terminal at a freely chosen position within substantially one revolution at the innermost circumference of the grounding belt-like conductor without deterioration in the performance and characteristics of the filter element. Accordingly, the freedom with which the grounding terminal can be led from the magnetic core can be greatly increased.

In a case where the input terminal is extended within the magnetic circuit towards the first lead exit part, a direction of extension can be set as a winding direction of the coil part. By doing so, it is possible to extend the input terminal inside the magnetic circuit in the same direction as the winding direction of the coil part. Accordingly, the freedom with which the grounding terminal can be led from the magnetic core can be greatly increased.

It is also possible to make a length of an extension of the input terminal within the magnetic circuit less than 360° from a connection position of the input terminal.

It is also possible to lead the output terminal from one of the first lead exit part, the second lead exit part, or a third lead exit part provided separately. By doing so, the output terminal can be freely led from one of the first lead exit part and the second lead exit part, or from a third lead exit part provided separately. Accordingly, the freedom with which the output terminal can be led from the magnetic core can be greatly increased.

It is possible to compose the magnetic core of a tube-like pot-type core including the center core, and to dispose the first lead exit part and the second lead exit part at positions so that magnetic characteristics of two paths that pass both sides of the center core inside the pot-type core are substantially equal. By doing so, it is possible to provide a filter element with superior noise attenuation characteristics.

It is also possible to provide a filter element where the magnetic core is composed of a partitioned rectangular segmented core including the center core, and the first lead exit part and the second lead exit part are disposed by dividing both sides of the partitioned rectangular segmented core by the magnetic circuit that interlinks the coil part. By doing so, it is possible to provide a filter element with superior noise attenuation characteristics.

It is possible to construct the filter element so as to include one signal transmitting belt-like conductor and at least one grounding belt-like conductor and to act as a normal mode noise filter, or so as to include a plurality of signal transmitting belt-like conductors and at least one grounding belt-like conductor and to act as a common mode noise filter.

To achieve the stated third object, in a filter element according to the present invention, the respective signal transmitting belt-like conductors are disposed in parallel on one surface of the belt-like insulator so as to be separated from one another in a width direction of the belt-like insulator, and the filter element includes at least as many grounding belt-like conductors as signal transmitting belt-like conductors and the grounding belt-like conductors are disposed in parallel on another surface of the belt-like insulator so as to be separated from one another in the width direction of the belt-like insulator. With this construction, the grounding belt-like conductors that are capacitatively coupled with one signal transmitting belt-like conductor and the grounding belt-like conductors that are capacitatively coupled with other signal transmitting belt-like conductor are DC-connected to each other only via the grounding terminal. This means that compared to a construction where the respective grounding belt-like conductors are formed on a single belt-like conductor, it is possible to increase an AC potential difference generated between the respective grounding belt-like conductors, and as a result, it is possible to reduce the extent of capacitative coupling between one signal transmitting belt-like conductor and another signal transmitting belt-like conductor via the respective grounding belt-like conductor. Accordingly, it is possible to achieve a common mode filter element with superior noise attenuation characteristics.

In this case, it is possible to make the respective grounding belt-like conductors correspond to the respective signal transmitting belt-like conductors and to dispose a same number of the grounding belt-like conductors in parallel with each signal transmitting belt-like conductor. By doing so, it is possible to make one signal transmitting belt-like conductor mainly capacitatively coupled with the grounding belt-like conductors corresponding to that signal transmitting belt-like conductor and to reduce capacitative coupling with other grounding belt-like conductors. This means that it is possible to avoid capacitative coupling between one signal belt-like conductor and another signal transmitting belt-like conductor via the grounding belt-like conductors, and as a result, a common mode filter element with more superior noise attenuation characteristics can be realized.

Also, the respective signal transmitting belt-like conductors can be disposed in parallel so as to face only the corresponding grounding belt-like conductors. By doing so, it is possible to reliably avoid direct capacitative coupling between one signal transmitting belt-like conductor and the grounding belt-like conductors corresponding to another signal transmitting belt-like conductor. This means that it is possible to avoid capacitative coupling between one signal transmitting belt-like conductor and another signal transmitting belt-like conductor via the grounding belt-like conductor more reliably, and as a result it is possible to realize a common mode filter element with more superior attenuation characteristics.

It is also possible to form the respective signal transmitting belt-like conductors so as to be narrower than the corresponding grounding belt-like conductors and to dispose the signal transmitting belt-like conductors so as to be positioned within widths of the corresponding grounding belt-like conductors. By doing so, it is possible to always have the grounding belt-like conductors disposed between the respective signal transmitting belt-like conductors in the wound state. Accordingly, since the grounding belt-like conductor has a shielding effect, it is possible to reduce mutual interference between the signals propagated on the signal transmitting belt-like conductors, so that a common mode filter element that has more superior noise attenuation characteristics can be realized.

Another filter element according to the present invention includes: a plurality of coil parts that are respectively formed in tube-like shapes by winding a signal transmitting belt-like conductor and a grounding belt-like conductor in a layered state with a belt-like insulator in between and are constructed so as to be magnetically coupled to one another; input terminals that are provided on the respective coil parts and are connected to first ends of the respective signal transmitting belt-like conductors; output terminals that are provided on the respective coil parts and are connected to second ends of the respective signal transmitting belt-like conductors; and grounding terminals that are provided on the respective coil parts and are connected to the respective grounding belt-like conductors. With this filter element, by combining a plurality of coil parts of the same type, it is possible to easily realize a common mode filter element for mounting on a multiphase transmission line with three phases, for example. Since the extent of capacitative coupling between one signal transmitting belt-like conductor and another signal transmitting belt-like conductor via the grounding belt-like conductors can be greatly reduced, it is possible to realize a common mode filter element with superior attenuation characteristics.

In this case, it is possible to form the plurality of coil parts by winding the signal transmitting belt-like conductors and the grounding belt-like conductors so that the grounding belt-like conductors are outside the signal transmitting belt-like conductors and the coil parts are formed with a hollow in centers thereof, to respectively connect the respective input terminals to outer circumferential parts of the respective signal transmitting belt-like conductors and respectively lead the input terminals from outer circumferential positions of the coil parts, to respectively connect the respective output terminals to inner circumferential parts of the respective signal transmitting belt-like conductors and respectively lead the respective output terminals from inner circumferential positions of the coil parts that are located on opposite sides to leading positions of the input terminals with the hollows in between, and to respectively lead the respective grounding terminals from outer circumferential positions of the coil parts that are located on opposite sides to leading positions of the input terminals with leading positions of the output terminals in between so as to be able to ground outer circumferential parts of the respective grounding belt-like conductors.

As an alternative, it is possible to form the plurality of coil parts by winding the signal transmitting belt-like conductors and the grounding belt-like conductors so that the grounding belt-like conductors are inside the signal transmitting belt-like conductors and the coil parts are formed with a hollow in centers thereof, to respectively connect the respective input terminals to inner circumferential parts of the respective signal transmitting belt-like conductors and respectively lead the input terminals from inner circumferential positions of the coil parts, to lead the respective grounding terminals from inner circumferential positions of the coil parts that are located on opposite sides to leading positions of the input terminals with the hollows in between so as to be able to ground inner circumferential parts of the respective grounding belt-like conductors, and to respectively connect the respective output terminals to outer circumferential parts of the respective signal transmitting belt-like conductors and to respectively lead the output terminals from outer circumferential positions of the coil parts that are located on opposite sides to leading positions of the input terminals with leading positions of the grounding terminals in between. In this way, it is possible to define the positions of the grounding belt-like conductors for the signal transmitting belt-like conductors and the respective leading positions of a plurality of input terminals, a plurality of output terminals, and a grounding terminal, so that a large attenuation can be achieved in a predetermined bandwidth and as a result, a common mode filter element with superior attenuation characteristics can be realized.

It should be noted that the disclosure of the present invention relates to a content of Japanese Patent Application 2003-208279 that was filed on 21 Aug. 2003, Japanese Patent Application 2003-375590 that was filed on 5 Nov. 2003, and Japanese Patent Application 2003-432706 that was filed on 26 Dec. 2003, the entire contents of which are herein incorporated by reference.

BRIEF DESCRIPTION OF THE DRAWINGS

These and other objects and features of the present invention will be explained in more detail below with reference to the attached drawings, wherein:

FIG. 15 is an attenuation characteristics graph showing the relationship between frequency and attenuation for filter elements of a Specific Embodiment 1 and a Comparative Example 1;

FIG. 16 is an attenuation characteristics graph showing the relationship between frequency and attenuation for filter elements of a Specific Embodiment 2 and a Comparative Example 2;

DESCRIPTION OF THE PREFERRED EMBODIMENTS

Preferred embodiments of a filter element according to the present invention will now be described with reference to the attached drawings.

First Embodiment

First, a filter element 1 according to a first embodiment of the present invention will be described with reference to the drawings.

Figure 1:
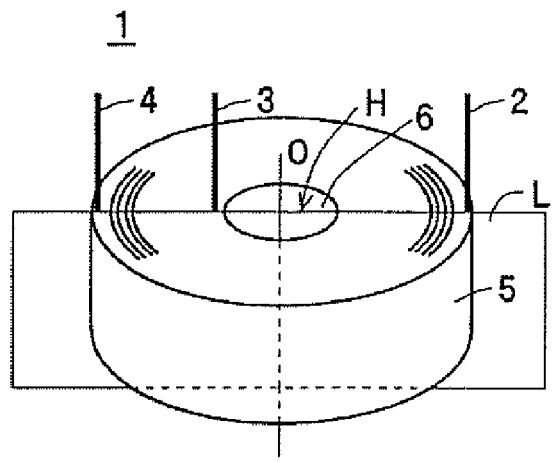
FIG. 1 is a perspective view showing the construction of a filter element according to a first embodiment of the present invention.

As shown in FIG. 1, the filter element 1 is constructed of an input terminal 2, an output terminal 3, a grounding terminal 4, a coil part 5 and a pillar-shaped (as one example, a cylinder-shaped) magnetic body (magnetic core) 6, and functions as a distributed constant-type three-terminal noise filter (a low-pass normal mode filter).

Figure 3:
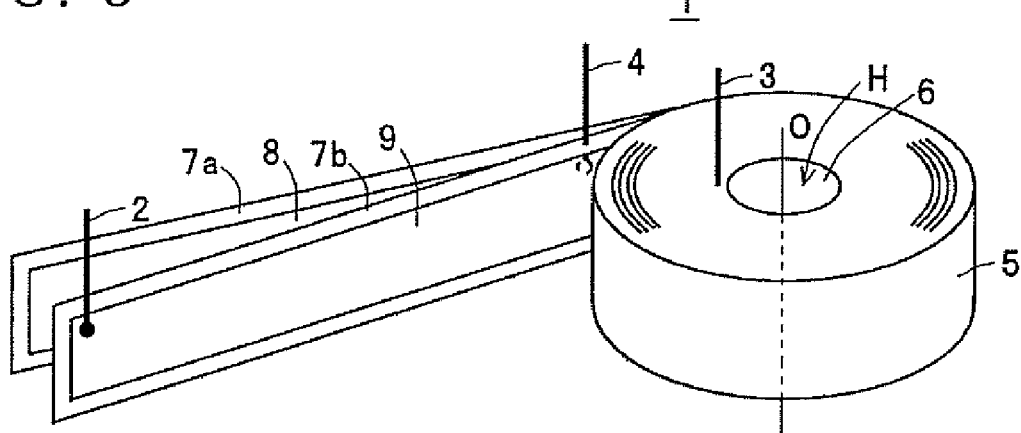
FIG. 3 is a perspective view of a state where first end parts of two belt-like insulators, a grounding conductor, and a signal conductor have been unwound to show the construction of the filter element shown in FIG. 1.

As shown in FIG. 3, the coil part 5 can include two belt-like insulators 7a, 7b formed with the same width, and a grounding belt-like conductor 8 and a signal transmitting belt-like conductor 9 that are formed narrower than the respective belt-like insulators 7a, 7b. In this case, the respective belt-like insulators 7a, 7b are composed of materials that have both dielectric and electrically insulating characteristics. The grounding belt-like conductor (hereinafter also referred to as the "grounding conductor") 8 has a first end electrically connected to one end of the grounding terminal 4. The grounding conductor 8 is placed on the belt-like insulator 7a so as to be positioned in a central part of the belt-like insulator 7a in the width direction. The belt-like insulator 7b is placed on the belt-like insulator 7a so that the grounding belt-like conductor 8 is sandwiched between the belt-like insulators 7a, 7b. On the other hand, the signal transmitting belt-like conductor 9 (hereinafter also referred to as the "signal conductor") has a first end electrically connected to one end of the input terminal 2 and a second end electrically connected to one end of the output terminal 3. The signal conductor 9 is placed on the belt-like insulator 7b so as to be positioned in a central part of the belt-like insulator 7b in the width direction. That is the respective conductors 8, 9 are placed on the belt-like insulator 7a so as to sandwich the belt-like insulator 7b in between the conductors 8 and 9. The coil part 5 is formed as shown in FIG. 1 in the overall shape of a tube (a round cylinder with a hollow H formed in the center) by winding the belt-like insulators 7a, 7b and the conductors 8, 9 that have been placed on top of each other with the second ends of the conductors 8, 9 as the winding start so that the grounding conductor 8 is disposed outside the signal conductor 9. The magnetic core 6 is attached inside the hollow H, and is disposed in a central part of the coil part 5.

Figure 2:
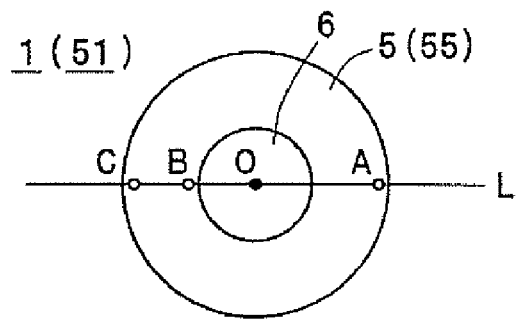
FIG. 2 is a plan view showing respective lead positions of input terminals, output terminals, and a grounding terminal, when looking from an end surface of the filter element according to the first and third embodiments of the present invention.

In this case, the first end (outermost circumferential part) of the signal conductor 9 to which the input terminal 2 is connected is positioned on an outer circumference of the coil part 5 and, as shown in FIG. 1, the input terminal 2 is led from an outer circumferential position (the lead position A in FIG. 2) on one end surface (the upper end surface in FIG. 1) of the coil part 5. On the other hand, the second end (innermost circumferential part) of the signal conductor 9 to which the output terminal 3 is connected is positioned at the center of the coil part 5 and, as shown in FIG. 1, the output terminal 3 is led from a central position (the lead position B in FIG. 2) on one end surface of the coil part 5. Here, as shown in FIG. 2, the lead position B of the output terminal 3 lies on a virtual plane L (hereinafter also referred to as the "plane L") that includes the center axis O of the coil part 5 and the lead position A of the input terminal 2 and is set on an opposite side to the lead position A with the center axis O (the magnetic core 6) in between. The first end (outermost circumferential part) grounding conductor 8 to which the grounding terminal 4 is connected is positioned on an outer circumference of the coil part 5 and, as shown in FIG. 1, the grounding terminal 4 is led from an outer circumferential position (the lead position C in FIG. 2) on an end surface of the coil part 5. More specifically, as shown in FIG. 2, the lead position C of the grounding terminal 4 is set on the plane L on the opposite side to the lead position A with the lead position B in between. Here, for the present invention, the expression "lead position" for the input terminal 2 and the like refers to a position on a surface of the coil part 5 where the input terminal 2 and the like protrude from the coil part 5. Accordingly, even in a construction where the coil part 5 is enclosed in a pot core (a magnetic body) and the like and the positions at which the input terminal 2 and the like are led from the pot core differ to the positions at which the input terminal 2 and the like are led from the coil part 5, it is the lead positions from the coil part 5 that are the "lead positions" for the input terminal 2 and the like. In the same way, even when the input terminal 2 and the like that are led from the coil part 5 are connected to the terminals mounted on a bobbin, the lead positions from the coil part 5 are the "lead positions" for the input terminal 2 and the like. Accordingly, it is not necessary to dispose the terminals mounted on a bobbin on the plane L, and the bobbin feet can be disposed at freely chosen positions.

According to this filter element 1, by including: the coil part 5 that is formed in the overall shape of a tube with the grounding conductor 8 wound on the outside of the signal conductor 9 and has the magnetic core 6 disposed in a center thereof; the input terminal 2 that is connected to an outermost circumferential part of the signal conductor 9 and is led from an outer circumferential position (the lead position A) on the coil part 5; the output terminal 3 that is connected to an innermost circumferential part of the signal conductor 9 and is led from a central position (the lead position B) of the coil part 5 located on an opposite side to the lead position A of the input terminal 2 with the magnetic core 6 in between; and the grounding terminal 4 that is connected to an outermost circumferential part of the grounding conductor 8 and is led from an outer circumferential position (the lead position C) on the coil part 5 located on an opposite side to the lead position A of the input terminal 2 with the lead position B of the output terminal 3 in between, as shown by the symbol P in FIG. 15, it is possible to maintain a large attenuation (an attenuation of 50 db or above) in a predetermined bandwidth (in the graph, around 1.5 MHz to 15 MHz), so that a normal mode filter element with superior attenuation characteristics can be realized.

Second Embodiment

Next, the construction of a filter element 11 according to the second embodiment will be described with reference to FIG. 4 to FIG. 6. It should be noted that component parts that are the same as the filter element 1 are designated by the same reference numerals and duplicated description thereof has been omitted.

Figure 4:
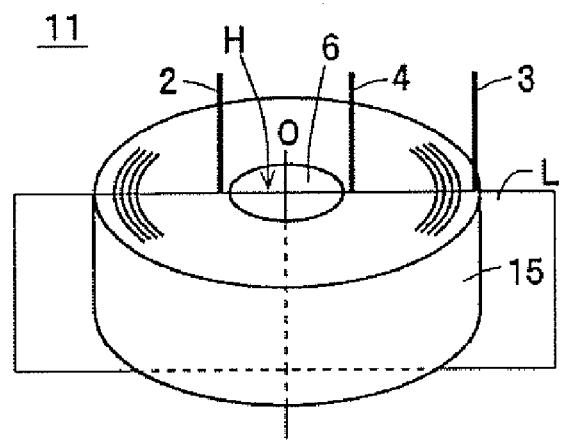
FIG. 4 is a perspective view showing the construction of a filter element according to a second embodiment of the present invention.

As shown in FIG. 4, the filter element 11 is constructed of the input terminal 2, the output terminal 3, the grounding terminal 4, a coil part 15, and the cylindrical magnetic core 6, and functions as a distributed constant-type three-terminal noise filter (a low-pass normal mode noise filter).

Figure 6:
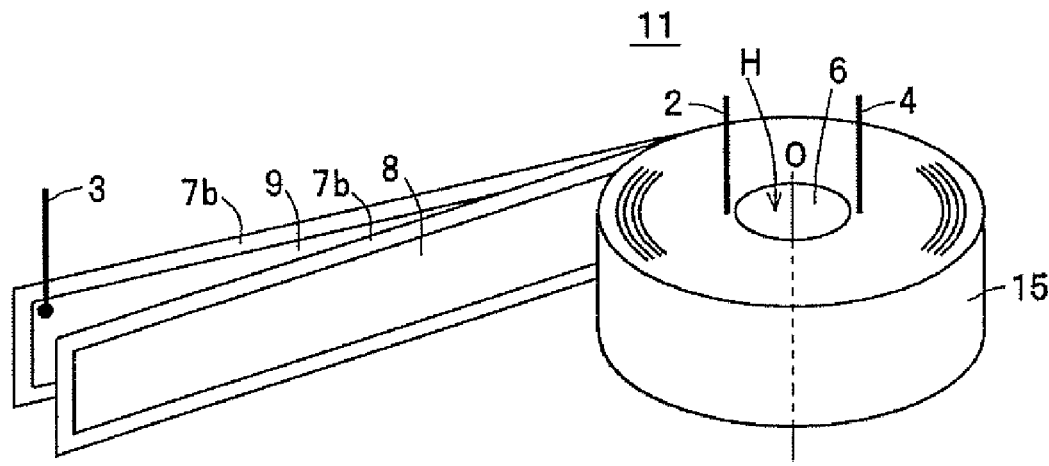
FIG. 6 is a perspective view of a state where first end parts of two belt-like insulators, a grounding conductor, and a signal conductor have been unwound to show the construction of the filter element shown in FIG. 4.

As shown in FIG. 6, the coil part 15 includes the belt-like insulators 7a, 7b and the conductors 8, 9. In this case, the signal conductor 9 has a first end electrically connected to one end of the output terminal 3 and a second end electrically connected to one end of the input terminal 2. Also, the signal conductor 9 is placed on the belt-like insulator 7a so as to be positioned in a central part of the belt-like insulator 7a in the width direction. The belt-like insulator 7b is placed on the belt-like insulator 7a so that the signal conductor 9 is sandwiched between the belt-like insulators 7a, 7b. On the other hand, a second end of the grounding conductor 8 is electrically connected to one end of the grounding terminal 4. The grounding conductor 8 is placed on the belt-like insulator 7b so as to be positioned in a central part of the belt-like insulator 7b in the width direction. That is, the conductors 8, 9 are placed on the belt-like insulator 7a with the belt-like insulator 7b in between the conductors 8 and 9. The coil part 15 is formed in the overall shape of a cylindrical tube with a hollow H formed in a center by winding the belt-like insulators 7a, 7b and the conductors 8, 9 that have been placed on top of each other with the second end of the conductors 8, 9 as the winding start so that the signal conductor 9 is disposed outside the grounding conductor 8. The magnetic core 6 is attached inside the hollow H of the coil part 15.

In this case, the second end (innermost circumferential part) of the signal conductor 9 to which the input terminal 2 is connected is positioned at an inner circumference of the coil part 15 and, as shown in FIG. 4, the input terminal 2 is led from a central position (the lead position A in FIG. 5) on one end surface of the coil part 15. The second end (innermost circumferential part) of the grounding conductor 8 to which the grounding terminal 4 is connected is positioned on an inner circumference of the coil part 15 and, as shown in FIG. 4, the grounding terminal 4 is led from a central position (the lead position C in FIG. 5) on an end surface of the coil part 15. Here, as shown in FIG. 5, the lead position C of the grounding terminal 4 lies on a plane L that includes the lead position A of the input terminal 2 and the central axis O of the coil part 15, and is set on an opposite side to the lead position A of the input terminal 2 with the central axis O (the magnetic core 6) in between. On the other hand, the first end (outermost circumferential part) of the signal conductor 9 to which the output terminal 3 is connected is positioned at the outer circumference of the coil part 15 and, as shown in FIG. 4, the output terminal 3 is led from a outer circumferential position (the lead position B in FIG. 5) on one end surface of the coil part 15. More specifically, as shown in FIG. 5, the lead position B of the output terminal 3 is set on the plane L on an opposite side to the lead position A of the input terminal 2 with the lead position C of the grounding terminal 4 in between.

According to this filter element 11, by including: the coil part 15 that is formed in the overall shape of a tube with the signal conductor 9 wound on the outside of the grounding conductor 8 and has the magnetic core 6 disposed in a center thereof; the input terminal 2 that is connected to an innermost circumferential part of the signal conductor 9 and is led from a central position (the lead position A) of the coil part 15; the grounding terminal 4 that is connected to an innermost circumferential part of the grounding conductor 8 and is led from a central position (the lead position C) of the coil part 15 located on an opposite side to the lead position A of the input terminal 2 with the magnetic core 6 in between; and the output terminal 3 that is connected to an outermost circumferential part of the signal conductor 9 and is led from an outer circumferential position (the lead position B) of the coil part 15 positioned on an opposite side to the lead position A of the input terminal 2 with the lead position C of the grounding terminal 4 in between, as shown by the symbol R in FIG. 16, it is possible to maintain a large attenuation (an attenuation of 50 db or above) in a predetermined bandwidth (in the graph, around 0.7 MHz to 6 MHz), so that a normal mode filter element with superior attenuation characteristics can be realized.

Figure 7:
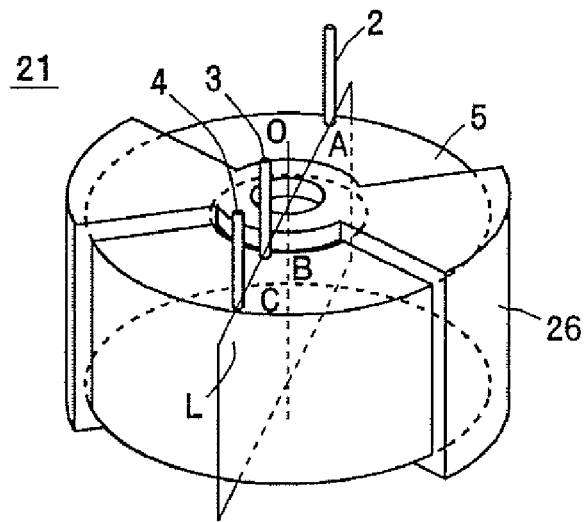
FIG. 7 is a perspective view showing the construction of a filter element according to another embodiment of the present invention.

It should be noted that the present invention is not limited to the above embodiments. As one example, although examples where the magnetic core 6 is attached inside the hollow H formed in the coil parts 5, 15 and the attenuation characteristics are improved by improving the distributed inductance value and the degree of coupling between the respective grounding conductors 8 and the signal conductors 9 have been described as the filter elements 1, 11 described above, it is possible to use a construction where instead of using magnetic core 6, the coil parts 5, 15 are set inside pot cores. With this construction, it is possible to further improve the distributed inductance value and the degree of coupling between the respective grounding conductors 8 and the signal conductors 9 while reducing the effects of external magnetic fields on the coil parts 5, 15. In this case, it is possible to use pot cores of the various shapes shown in FIG. 7 to FIG. 9 as the pot core. In a filter element 21 in which the pot core 26 is used, the input terminal 2, the output terminal 3, and the grounding terminal 4 are led from cutaway parts of the pot core 26 shown in FIG. 7.

Figure 8:
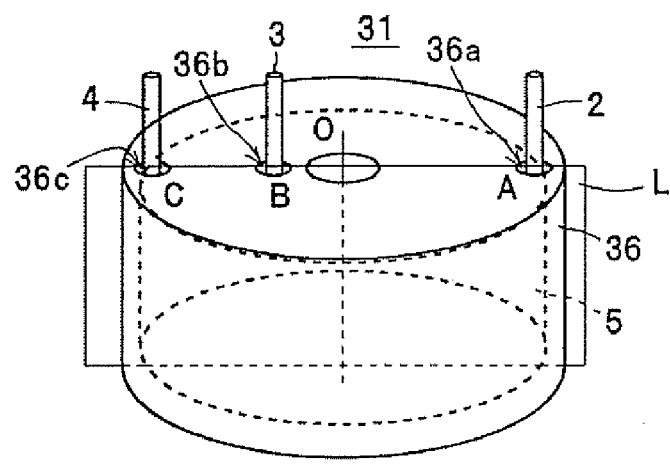
FIG. 8 is a perspective view showing the construction of a filter element according to another embodiment of the present invention.

On the other hand, when, as in a filter element 31 shown in FIG. 8, a pot core 36 with a construction where cutaway parts or openings are formed from the outset in a side surface that faces the end surface of a coil part (for example, the coil part 5 in FIG. 8) from which the input terminal 2, the output terminal 3, and the grounding terminal 4 are led is used, holes 36a, 36b, 36c are formed in the side surface of the pot core 36 respectively corresponding to the lead positions A, B, and C of the input terminal 2, the output terminal 3, and the grounding terminal 4 of the coil part 5, and the input terminal 2, the output terminal 3, and the grounding terminal 4 are led from the pot core 36.

Figure 9:
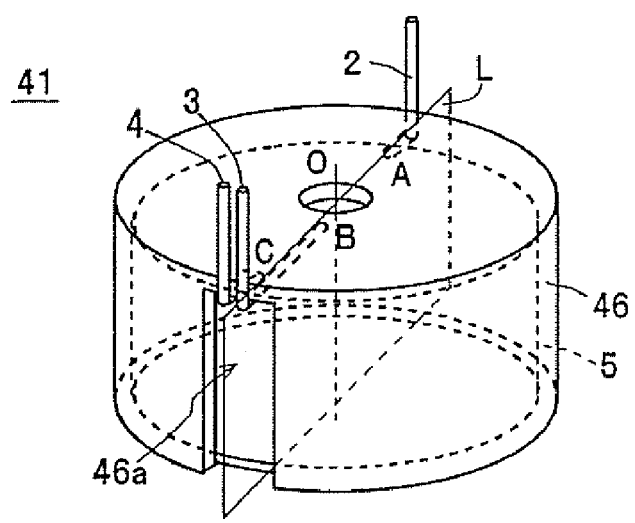
FIG. 9 is a perspective view showing the construction of a filter element according to another embodiment of the present invention.
Figure 10:
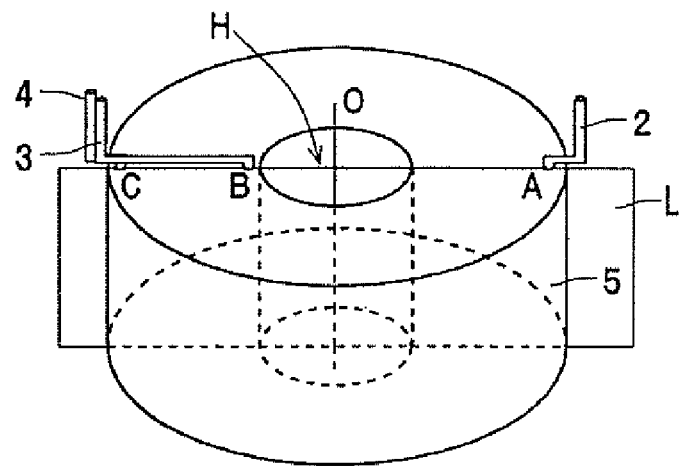
FIG. 10 is a perspective view of the coil part used in the filter element shown in FIG. 9.

When, as in a filter element 41 shown in FIG. 9, a pot core 46 with a construction where cutaway parts (openings) 46a are formed only in a circumferential surface with no cutaway parts or openings being present in the side surface corresponding to the end surface of a coil part (for example, the coil part 5 in FIG. 9) from which the input terminal 2, the output terminal 3, and the grounding terminal 4 are led is used, by extending the input terminal 2, the output terminal 3, and the grounding terminal 4 led from predetermined positions (the lead positions A, B, C) on the coil part 5 as shown in FIG. 10 along the end surface of the coil part 5 as far as the outer circumference of the coil part 5, it is possible to lead the terminals out of the pot core 46 via the cutaway parts (openings) 46a as shown in FIG. 9. It should be noted that although not shown, it should be obvious that pot cores of shapes aside from the pot cores 26, 36, and 46 described above can be used.

Third Embodiment

Next, the construction of a filter element 51 according to the third embodiment of the present invention will be described with reference to the drawings.

First, the construction of the filter element 51 will be described. It should be noted that the filter element 51 can be constructed as a common mode filter element based on the filter element 1 that functions as a normal mode filter. This means that most of the component parts are the same as the corresponding component parts of the filter element 1. Accordingly, component parts that are the same as the filter element 1 are designated by the same reference numerals and duplicated description thereof has been omitted.

Figure 11:
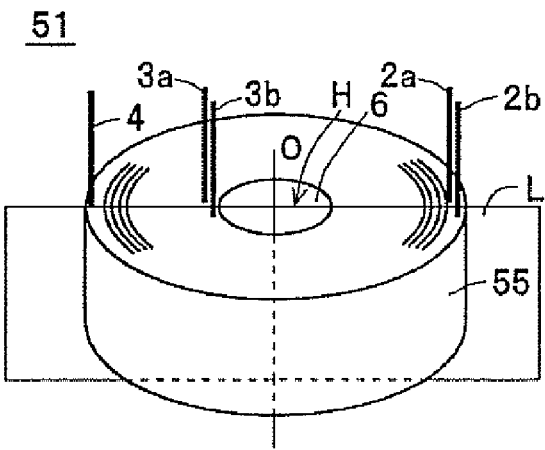
FIG. 11 is a perspective view showing the construction of a filter element according to another embodiment of the present invention.

As shown in FIG. 11, the filter element 51 is constructed of a pair of input terminals 2a, 2b (hereinafter referred to as the "input terminal 2" when no distinction is required), a pair of output terminals 3a, 3b (hereinafter referred to as the "output terminal 3" when no distinction is required), the grounding terminal 4, a coil part 55, and a round cylindrical magnetic core 6, and functions as a distributed constant-type common mode noise filter (a low-pass filter).

Figure 12:
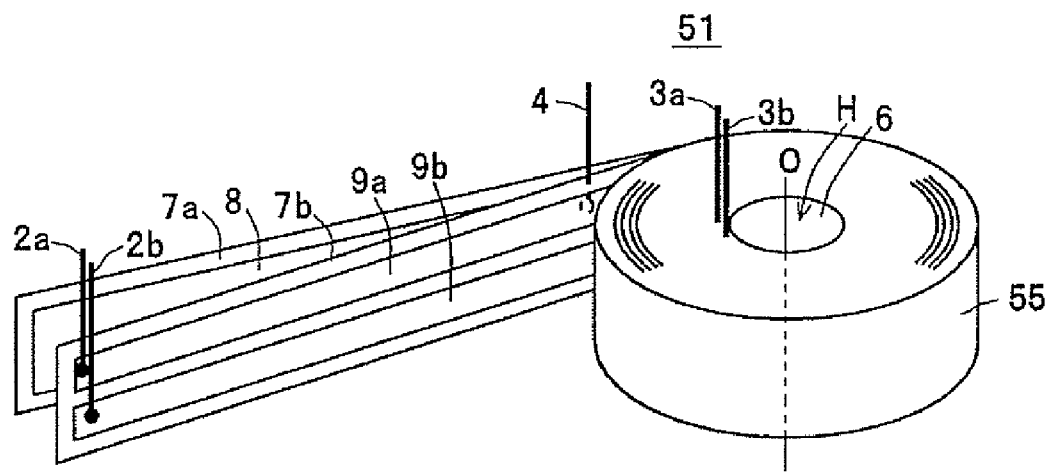
FIG. 12 is a perspective view of a state where first end parts of two belt-like insulators, a grounding conductor, and two signal conductors have been unwound to show the construction of the filter element shown in FIG. 11.

As shown in FIG. 12, the coil part 55 includes the belt-like insulators 7a, 7b, the grounding belt-like conductor 8, and a pair of signal transmitting belt-like conductors 9a, 9b (hereinafter referred to as the "signal conductor 9" when no distinction is required). In this case, the grounding conductor 8 has a first end electrically connected to one end of the grounding terminal 4 and is placed on the belt-like insulator 7a. As one example, the signal conductors 9a, 9b are formed with the same width, and are placed, in parallel so as to not contact each other, on the belt-like insulator 7b placed on the belt-like insulator 7a so that the grounding conductor 8 is sandwiched between the belt-like insulators 7a, 7b. Also, the signal conductors 9a, 9b have first ends that are respectively electrically connected to ends of the input terminals 2a, 2b and second ends that are respectively electrically connected to ends of the output terminals 3a, 3b. That is, the respective conductors 8, 9 are placed on the belt-like insulator 7a with the belt-like insulator 7b in between the conductors 8 and 9. The coil part 55 is formed as shown in FIG. 11 in the overall shape of a tube (a round cylinder with a hollow H formed in the center) by winding the belt-like insulators 7a, 7b and the conductors 8, 9a, 9b that have been placed on top of each other with the second ends of the conductors 8, 9a, 9b as the winding start so that the grounding conductor 8 is disposed outside the signal conductors 9a, 9b. The magnetic core 6 is attached inside the hollow H of the coil part 15.

In this case, the respective first ends (outermost circumferential parts) of the signal conductors 9a, 9b to which the input terminals 2a, 2b are connected are positioned on the outer circumference of the coil part 55 and in the same way as in the filter element 1, the input terminals 2a, 2b are led from a lead position A on the coil part 55 as shown in FIG. 2. On the other hand, the respective second ends (innermost circumference parts) of the signal conductors 9a, 9b to which the output terminals 3a, 3b are connected are positioned in the center of the coil part 55 and in the same way as in the filter element 1, the output terminals 3a, 3b are led from a lead position B on the coil part 55 as shown in FIG. 2. In the same way as in the filter element 1, as shown in FIG. 2, the grounding terminal 4 is led from a lead position C on the coil part 55.

According to the filter element 51, common mode noise is propagated simultaneously on a path from the input terminal 2a to the output terminal 3a via the signal conductor 9a and on a path from the input terminal 2b to the output terminal 3b via the signal conductor 9b, and flows into the grounding conductor 8. This means that in terms of common mode noise, the pair of input terminals 2a, 2b, the pair of signal conductors 9a, 9b and the pair of output terminals 3a, 3b can be respectively regarded as a single input terminal 2, a single signal conductor 9, and a single output terminal 3. Accordingly, with regard to common mode noise the filter element 51 functions so as to exhibit favorable attenuation characteristics in the same way as the filter element 1 functions so as to exhibit favorable attenuation characteristics for normal mode noise.

Fourth Embodiment

Next, a filter element 61 according to a fourth embodiment of the present invention will be described with reference to the drawings.

First, the construction of the filter element 61 will be described. It should be noted that the filter element 61 is constructed so as to be capable of functioning as a common mode filter that is based on the filter element 11 that functions as a normal mode filter. For this reason, the filter element 61 includes many of the same component parts as the filter element 11. Also, since the filter element 61 is constructed like the filter element 51 so as to function as a common mode filter, the filter element 61 includes many of the same component parts as the filter element 51. Accordingly, component parts that are the same as in the filter element 11 and the filter element 51 are designated by the same reference numerals and duplicated description thereof has been omitted.

Figure 13:
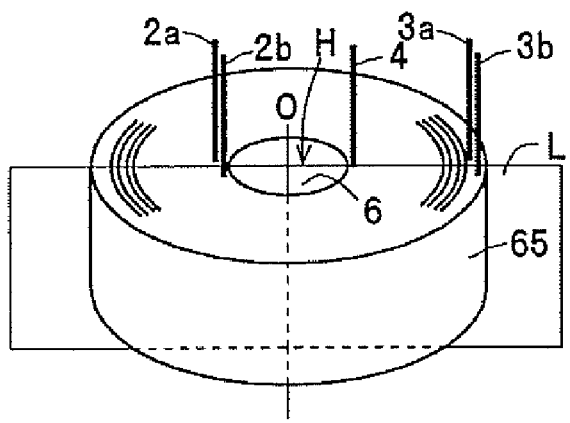
FIG. 13 is a perspective view showing the construction of a filter element according to another embodiment of the present invention.

As shown in FIG. 13, the filter element 61 includes the pair of input terminals 2 (2a, 2b), the pair of output terminals 3 (3a, 3b), the grounding terminal 4, a coil part 65, and the circular cylindrical magnetic core 6, and functions as a distributed constant-type common mode noise filter (a low-pass filter).

Figure 14:
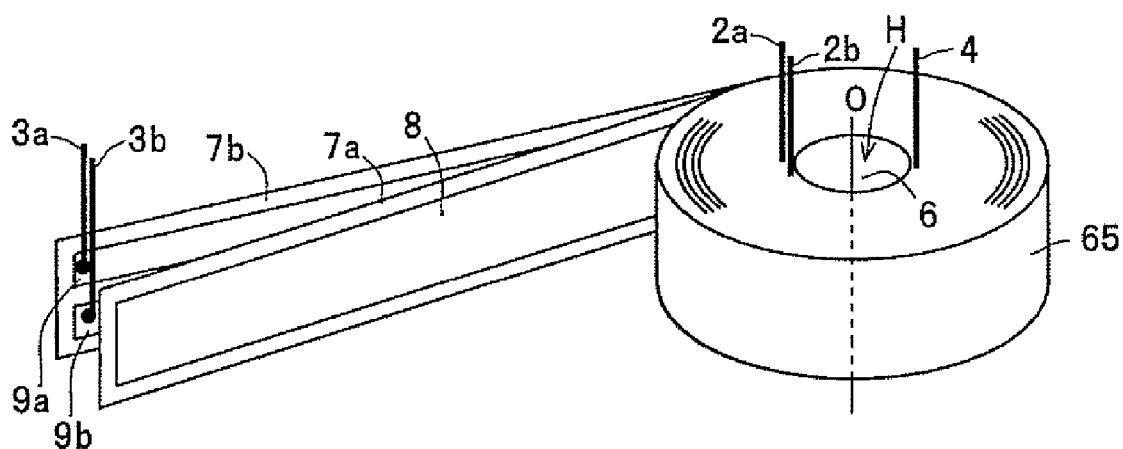
FIG. 14 is a perspective view of a state where first end parts of two belt-like insulators $7a$, $7b$, a grounding conductor 8, and two signal conductors $9a$, $9b$ have been unwound to show the construction of the filter element 61.

As shown in FIG. 14, the coil part 65 includes the belt-like insulators 7a, 7b, the grounding belt-like conductor 8, and the pair of signal transmitting belt-like conductors 9a, 9b. In this case, the signal conductors 9a, 9b have first ends electrically connected to one end of the respective output terminals 3a, 3b and second ends electrically connected to one end of the respective input terminals 2a, 2b and are placed on the belt-like insulator 7a. As one example, the respective signal conductors 9a, 9b are formed with the same width. The grounding conductor 8 is placed on the belt-like insulator 7b that is placed on the belt-like insulator 7a so that the signal conductors 9a, 9b are sandwiched between the belt-like insulators 7a, 7b. That is, the respective conductors 8, 9 are placed on the belt-like insulator 7a with the belt-like insulator 7b in between the conductors 8 and 9. The coil part 65 is formed as shown in FIG. 13 in the overall shape of a tube (a round cylinder with a hollow H formed in the center) by winding the belt-like insulators 7a, 7b and the conductors 8, 9a, 9b that have been placed on top of each other with the second ends of the conductors 8, 9a, 9b as the winding start so that the signal conductors 9a, 9b are disposed outside the grounding conductor 8. The magnetic core 6 is attached inside the hollow H of the coil part 65.

Figure 5:
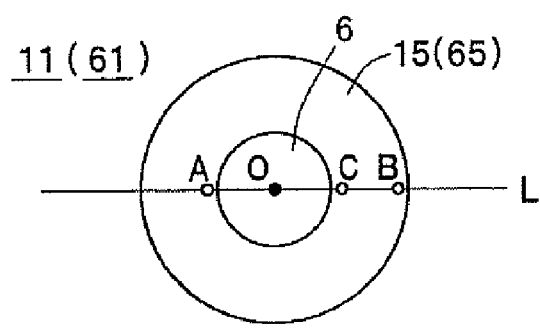
FIG. 5 is a plan view showing respective lead positions of input terminals, output terminals, and a grounding terminal, when looking from an end surface of the filter element according to the second and fourth embodiments of the present invention.

In this case, the respective second ends (innermost circumferential parts) of the signal conductors 9a, 9b to which the input terminals 2a, 2b are connected are positioned in the center of the coil part 65 and in the same way as in the filter element 11, the input terminals 2a, 2b are led from a lead position A on the coil part 65 as shown in FIG. 5. On the other hand, the respective first ends (outermost circumferential parts) of the signal conductors 9a, 9b to which the output terminals 3a, 3b are connected are positioned on the outer circumference of the coil part 65 and in the same way as in the filter element 11, the output terminals 3a, 3b are led from a lead position B on the coil part 65 as shown in FIG. 5. In the same way as in the filter element 11, the grounding terminal 4 is led from a lead position C on the coil part 65 as shown in FIG. 5.

According to the filter element 61, in the same way as the filter element 51, in terms of common mode noise, the pair of input terminals 2a, 2b, the pair of signal conductors 9a, 9b and the pair of output terminals 3a, 3b can be respectively regarded as a single input terminal 2, a single signal conductor 9, and a single output terminal 3. Accordingly, with regard to common mode noise the filter element 61 functions so as to exhibit favorable attenuation characteristics in the same way as the filter element 11 functions so as to exhibit favorable attenuation characteristics for normal mode noise.

It should be noted that although not shown, it should be obvious that pot cores (for example, the pot cores 26, 36, and 46 shown in FIG. 7 to FIG. 9) can be used in place of the magnetic core 6 for the filter elements 51, 61.

In the respective filter elements 1 to 61 described above, constructions are used where the input terminals 2, the output terminals 3, and the ground terminals 4 are disposed on only one end surface (the upper end surface in FIG. 1) of the coil part, but the input terminals 2, the output terminals 3, and the ground terminals 4 only need to be arranged on a plane L including the center axis O of the coil part, so that constructions where some of the input terminals 2, the output terminals 3, and the ground terminals 4 are disposed on the opposite end surface (the lower end surface in FIG. 1) can also be used. In addition in the filter elements 1 to 61 described above, a construction is used where the input terminals 2, the output terminals 3, and the ground terminals 4 are disposed on a plane L including the center axis O of the coil part, but all of the terminals do not need to be disposed exactly on the plane L, and the respective terminals may be disposed at positions somewhat displaced from the plane L. In this case, although there is a slight decrease in the attenuation characteristics compared to the filter elements 1 to 61 described above, sufficiently favorable attenuation characteristics are still exhibited compared to conventional filter elements. Putting this another way, by disposing the input terminals 2, the output terminals 3, and the grounding terminals 4 on the plane L that includes the center axis O of the coil part, it is possible to achieve an even greater attenuation in a predetermined bandwidth, and as a result it is possible to realize a normal mode or common mode filter element with more superior (optimal) attenuation characteristics. Also, although the respective filter elements 1 to 61 are constructed by attaching the magnetic core 6 into the hollow H in the coil parts 5, 15, 55, 65 or by using the pot cores 26, 36, 46, it is also possible to construct air core-type filter elements that do not use the magnetic core 6 or the pot cores 26, 36, 46. However, by attaching a pillar-shaped magnetic core 6 to the hollow H, it is possible to improve the distributed inductance value and the degree of coupling between the belt-like insulator 7a for grounding and the belt-like insulator 7b for signal transmission, so that it is possible to realize a filter element that has more superior attenuation characteristics and can attenuate noise of a lower frequency. Also, although constructions that include a pair of signal conductors 9a, 9b and function as common mode filters have been described for the filter elements 51, 61, it is possible to construct the filter elements so as to include three or more signal conductors.

Next, the present invention will be described in more detail by way of specific embodiments.

SPECIFIC EMBODIMENT 1

COMPARATIVE EXAMPLE 1

A coil part 55 was fabricated using a grounding conductor 8 whose width is set at 11 mm, a pair of signal conductors 9a, 9b whose widths are set at 3 mm, and a pair of belt-like insulators 7a, 7b formed from a polyimide insulating sheet whose thickness is set at 50 μm by winding 18 turns with the grounding conductor 8 on the outside of the respective signal conductors 9a, 9b. A filter element was then fabricated by attaching the fabricated core part 55 to a pot core (the model PC40P30/19Z-52H (made by TDK CORP)). In this case, a filter element in which the grounding terminal 4 is disposed on an opposite side to the input terminal 2 with the output terminal 3 in between was fabricated and set as Specific Embodiment 1 for the filter element 51 described above. In addition, in contrast to the arrangement of the lead positions A, B, and C for the input terminal 2, the output terminal 3, and the grounding terminal 4 of the Specific Embodiment 1, a filter element in which the lead position C of the grounding terminal 4 is disposed at substantially the same position as the lead position A of the input terminal 2 was fabricated and set as Comparative Example 1 for the filter element 51.

Next, the attenuation characteristics of the filter elements of the Specific Embodiment 1 and the Comparative Example 1 for different frequencies were measured using an R3767CG network analyzer manufactured by ADVANTEST CORP. At this time, a method was used where the pair of input terminals 2a, 2b were shorted, the pair of output terminals 3a, 3b were also shorted and test signals were simultaneously supplied to the signal conductors 9a, 9b. The various attenuation characteristics of the filter elements of the Specific Embodiment 1 and the Comparative Example 1 are shown in FIG. 15. The attenuation characteristics of the filter element of the Specific Embodiment 1 are shown by the symbol P, and the attenuation characteristics of the filter element of the Comparative Example 1 are shown by the symbol Q.

According to FIG. 15, an attenuation of 30 dB or above could not be achieved for the filter element of the Comparative Example 1. On the other hand, it was verified that the filter element according to the Specific Embodiment 1 can achieve a large attenuation (an attenuation of 50 dB or above) in a bandwidth of around 1.5 MHz to 15 MHz.

SPECIFIC EMBODIMENT 2

COMPARATIVE EXAMPLE 2

A coil part 65 was fabricated using a grounding conductor 8 whose width is set at 11 mm, a pair of signal conductors 9a, 9b whose widths are set at 3 mm, and a pair of belt-like insulators 7a, 7b formed from a polyimide insulating sheet whose thickness is set at 50 μm by winding 22 turns with the respective signal conductors 9a, 9b on the outside of the grounding conductor 8. A filter element was then fabricated by attaching the fabricated core part 65 to a pot core (the model H5C2P30/19Z-52H (made by TDK CORP)). In this case, a filter element in which the grounding terminal 4 is disposed on an opposite side to the input terminal 2 with the central axis O of the coil part 65 in between was fabricated and set as Specific Embodiment 2 for the filter element 61. In addition, in contrast to the arrangement of the lead positions A, B, and C for the input terminal 2, the output terminal 3, and the grounding terminal 4 of the Specific Embodiment 1, a filter element in which the lead position C of the grounding terminal 4 is disposed at substantially the same position as the lead position A of the input terminal 2 was fabricated and set as Comparative Example 2 for the filter element 61.

Next, the attenuation characteristics of the filter elements of the Specific Embodiment 2 and the Comparative Example 2 for different frequencies were measured using the same method as for the Specific Embodiment 1 and the Comparative Example 1 described above. The attenuation characteristics of the filter elements of the Specific Embodiment 2 and the Comparative Example 2 for different frequencies are shown in FIG. 16. In FIG. 16, the attenuation characteristics of the filter element of the Specific Embodiment 2 are shown by the symbol R, and the attenuation characteristics of the filter element of the Comparative Example 2 are shown by the symbol S.

According to FIG. 16, although an attenuation of 50 dB or above could be achieved for the filter element of the Comparative Example 2 at a bandwidth in the vicinity of around 18 MHz, such bandwidth is extremely narrow at around just 1 MHz. On the other hand, it was verified that the filter element according to the Specific Embodiment 2 can achieve an attenuation of 50 dB or above in a bandwidth of around 0.7 MHz to 6 MHz.

COMPARATIVE EXAMPLES 3, 4

Figure 18:
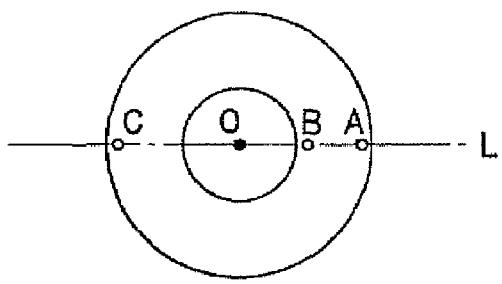
FIG. 18 is a diagram useful in explaining respective lead positions of the input terminal, the output terminal, and the grounding terminal of the filter element according to the Comparative Example 3.
Figure 19:
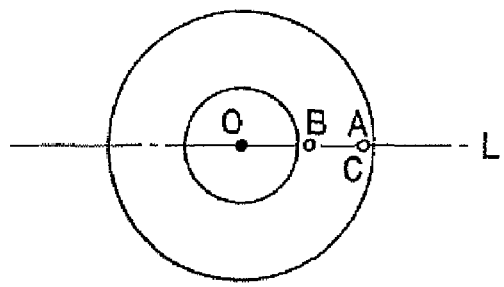
FIG. 19 is a diagram useful in explaining respective lead positions of the input terminal, the output terminal, and the grounding terminal of the filter element according to the Comparative Example 4.

A coil part was fabricated using a grounding conductor 8 whose width is set at 11 mm, a pair of signal conductors 9a, 9b whose widths are set at 3 mm, and a pair of belt-like insulators 7a, 7b formed from a polyimide insulating sheet whose thickness is set at 50 μm by winding 21 turns with the grounding conductor 8 on the outside of the respective signal conductors 9a, 9b. A filter element was then fabricated by attaching the fabricated core part to a pot core (the model PC40P30/19Z-52H (made by TDK CORP)). In this case, as shown in FIG. 18, compared to the arrangement of the lead positions A, B, and C for the input terminal 2 the output terminal 3, and the grounding terminal 4 of the Specific Embodiment 1, a filter element in which the lead position B of the output terminals 3a, 3b is disposed on an opposite side to the central axis O at the center of the coil part was fabricated and set as Comparative Example 3 for the filter element 51. Also, compared to the arrangement of the lead positions A, B, and C of the input terminal 2, the output terminal 3, and the grounding terminal 4 of the Comparative Example 3, as shown in FIG. 19 a filter element in which the lead position C of the grounding terminal 4 is at substantially the same position as the lead position A of the input terminal 2 was fabricated and set as a Comparative Example 4 for the filter element 51. In this case, the input terminal 2, the output terminal 3, and the grounding terminal 4 of the Comparative Examples 3, 4 are positioned on the plane L that includes the center axis O of the coil part.

Figure 17:
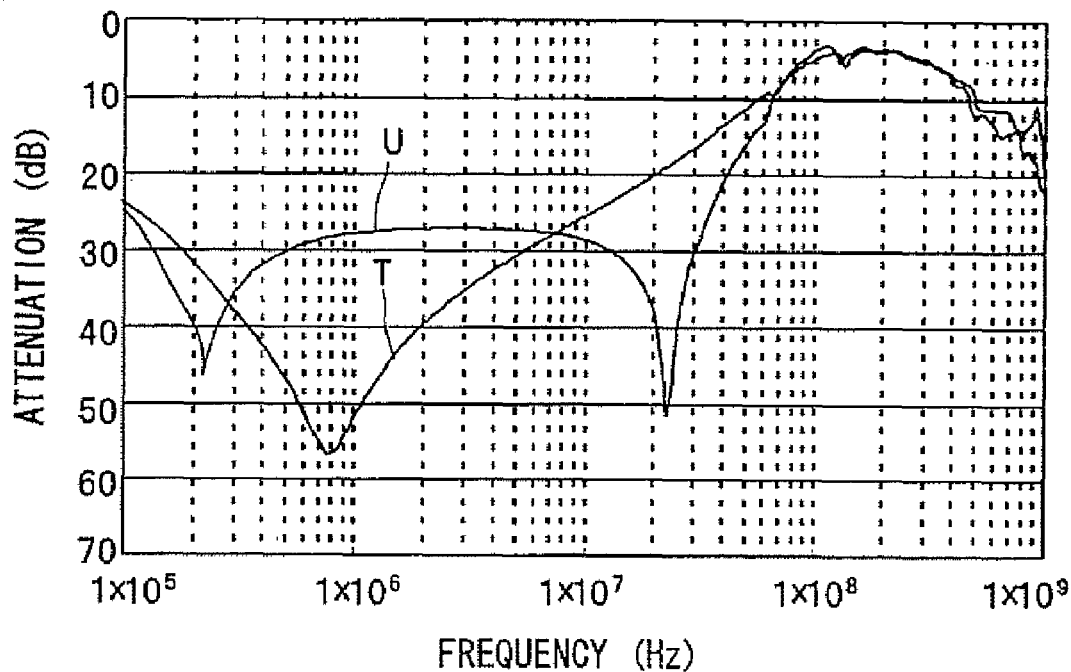
FIG. 17 is an attenuation characteristics graph showing the relationship between frequency and attenuation for filter elements of Comparative Examples 3 and 4.

Next, the attenuation characteristics of the filter elements of the Comparative Examples 3, 4 for different frequencies were measured using the same method as for the Specific Embodiment 1 and the Comparative Example 1 described above. The attenuation characteristics of the Comparative Examples 3, 4 for different frequencies are shown in FIG. 17. In FIG. 17, the attenuation characteristics of the filter element of the Comparative Example 3 are shown by the symbol T, and the attenuation characteristics of the filter element of the Comparative Example 4 are shown by the symbol U.

According to FIG. 17, although an attenuation of 50 dB or above could be achieved for the filter element of the Comparative Example 3 at a bandwidth of around 0.6 MHz to around 1 MHz, it was verified that compared to the Specific Embodiment 1, 2 described above, such characteristics have a narrow bandwidth. On the other hand, although it was verified that the filter element according to the Specific Embodiment 4 can achieve an attenuation of 50 dB or above in a bandwidth of around 2.3 MHz, it was verified that such characteristics have an extremely narrow bandwidth.

Fifth Embodiment

Next, the construction of a filter element 71 according to a fifth embodiment will be described with reference to FIG. 20 to FIG. 23. It should be noted that component parts that are the same as the filter element 51 are designated by the same reference numerals and duplicated description thereof is omitted.

First, the filter element 71 will be described with reference to the drawings.

Figure 20:
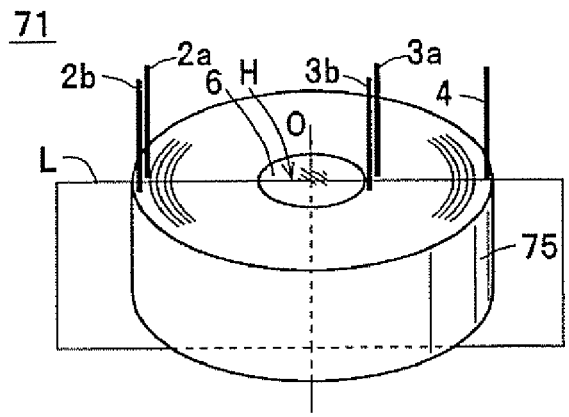
FIG. 20 is a perspective view showing the construction of a filter element according to a fifth embodiment of the present invention.

As shown in FIG. 20, the filter element 71 includes a plurality of (as one example, two) input terminals 2a, 2b, an equal number of (here, two) output terminals 3a, 3b as the input terminals 2, the grounding terminal 4, a coil part 75, and the magnetic core 6, and functions as a distributed constant-type five-terminal noise filter (low-pass common mode filter).

Figure 22:
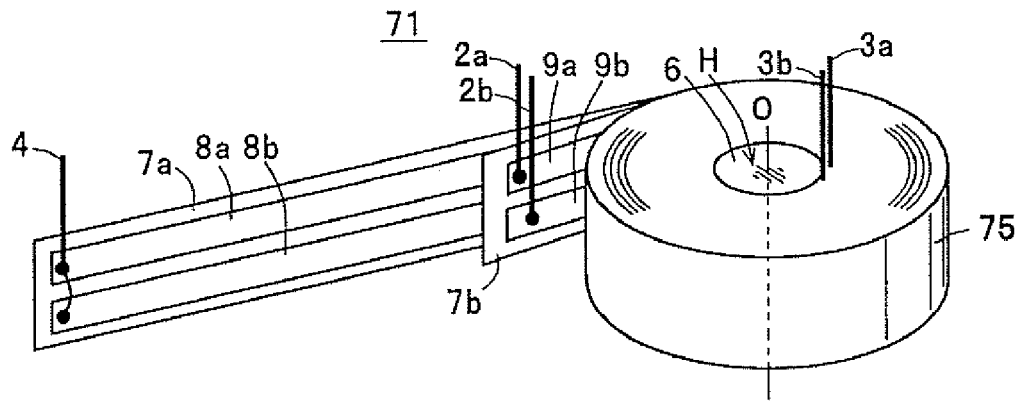
FIG. 22 is a perspective view of a filter element in a state where first end parts of belt-like insulators, grounding conductors, and signal conductors have been unwound to show the construction of the filter element shown in FIG. 20.

As shown in FIG. 22, the coil part 75 may include two belt-like insulators 7a, 7b formed with the same width, an equal number (here, two) of grounding belt-like conductors (grounding conductors) 8a, 8b as the input terminals 2, and an equal number (here, two) of signal conductors 9a, 9b as the input terminals 2. The belt-like insulators 7 are composed of a material that has both dielectric and electrically insulating characteristics. The respective grounding conductors 8 are set with the same widths and lengths, for example, and are disposed in parallel on the belt-like insulator 7a some distance apart in the width direction of the belt-like insulator 7a. The respective grounding conductors 8 are connected to each other at first ends (the winding end side), with these first ends both being electrically connected to one end of the grounding terminal 4. The belt-like insulator 7b is placed on the belt-like insulator 7a so that the grounding conductors 8 are sandwiched between the belt-like insulators 7a, 7b.

Figure 23:
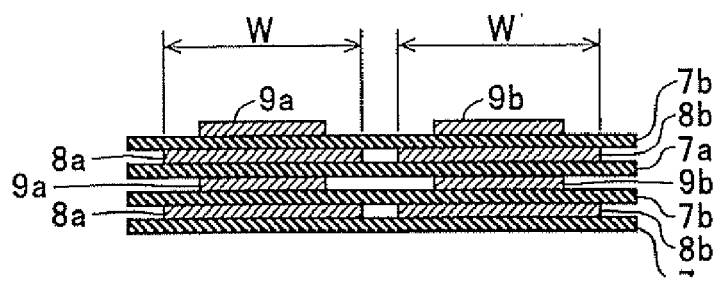
FIG. 23 is a cross-sectional view showing the layering of the belt-like insulators, grounding conductors, and signal conductors of the filter element shown in FIG. 20 taken along the width direction of such component parts.

On the other hand, the respective signal conductors 9 are set with the same width and the same length, for example, and as shown in FIG. 22, the signal conductors 9 are disposed in parallel on the belt-like insulator 7b some distance apart in the width direction of the belt-like insulator 7b. In this case, as shown in FIG. 23 the signal conductors 9 are formed so that the signal conductors 9 have narrower widths than the respective grounding conductors 8. As shown in FIG. 23, the signal conductor 9a is disposed so as to be positioned inside the width W of the corresponding grounding conductor 8a. By doing so, the signal conductor 9a is set in a state facing only the grounding conductor 8a with the belt-like insulator 7b in between. In the same way, the signal conductor 9b is disposed so as to be positioned inside the width W of the corresponding grounding conductor 8b, and in a state facing only the grounding conductor 8b with the belt-like insulator 7b in between, As shown in FIG. 22, the respective signal conductors 9a, 9b are constructed so as to respectively have first ends (the winding end-side) electrically connected to one end of the respective input terminals 2a, 2b and second ends (the winding start-side) electrically connected to one end of the respective output terminals 3a, 3b. With this construction, when the belt-like insulator 7b is used as a reference, the signal conductors 9a, 9b are disposed on a surface on one side thereof (the upper surface in FIG. 23) and the grounding conductors 8a, 8b are disposed on a surface on the other side thereof (the lower surface in FIG. 23) so as to respectively overlap the signal conductors 9a, 9b. As shown in FIG. 20, the coil part 75 is formed in the overall shape of a tube (a cylinder with a hollow H formed in a center) by winding the respective beltlike insulators 7, the respective grounding conductors 8, and the respective signal conductors 9 that have been placed on top of each other with the second ends of the conductors 8, 9 as the winding start so that the respective grounding conductors 8 are disposed outside the respective signal conductors 9. The magnetic core 6 is attached inside the hollow H, and is disposed in a central part of the coil part 75.

Figure 21:
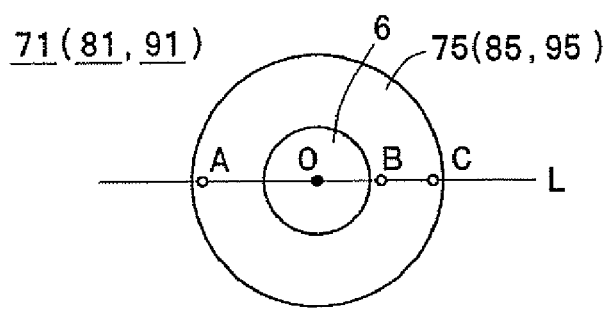
FIG. 21 is a plan view showing respective lead positions of input terminals, output terminals, and a grounding terminal, when looking from an end surface of the filter elements according to the fifth to seventh embodiments of the present invention.

In this case, the first ends (the outermost circumferential parts or "outer circumference parts" for the present invention) of the signal conductors 9 to which the input terminals 2 are connected are positioned on the outer circumference of the coil part 75 and, as shown in FIG. 20, the input terminals 2 are led from the outer circumferential positions (the lead position A in FIG. 21) on one side surface (the upper surface in FIG. 20) of the coil part 75. On the other hand, the respective second ends (the innermost circumferential parts or "inner circumference parts" for the present invention) of the signal conductors 9 to which the output terminals 3 are connected are positioned at the center of the coil part 75 and, as shown in FIG. 20, the output terminals 3 are led from a center (inner circumference) position (the lead position B in FIG. 21) on one side surface of the coil part 75. Here, as shown in FIG. 21, the lead position B of the respective output terminals 3 lies on a virtual plane L (hereinafter also referred to as the "plane L" that includes the center axis O of the coil part 75 and the lead position A of the respective input terminals 2, and is set on the opposite side to the lead position A with the center axis O (the hollow H, or in other words, the magnetic core 6) in between. The first ends of the respective grounding conductors 8 to which the grounding terminal 4 is connected are positioned on the outer circumference of the coil part 75, and as shown in FIG. 20, the grounding terminal 4 is led from an outer circumferential position (the lead position C in FIG. 21) on one end surface of the coil part 75. More specifically, as shown in FIG. 21, the lead position C of the grounding terminal 4 lies on the plane L and is set on an opposite side to the lead position A with the lead position B in between. Here, the "lead position" of the input terminals 2 and the like of the present invention refers to a position on a surface of the coil part 75 where the input terminal 2 and the like protrude from the coil part 75.

According to this filter element 71, by including: the coil part 75 that is formed in the overall shape of a tube with the hollow H formed in the center by winding two signal conductors 9, which are disposed in parallel on one surface side of the belt-like insulator 7b so as to be some distance apart in the width direction of the belt-like insulator 7b, and two grounding conductors 8, which are disposed in parallel on another surface side of the belt-like insulator 7b so as to be some distance apart in the width direction of the belt-like insulator 7b and to correspond to the respective signal conductors 9, with the belt-like insulator 7b in between the grounding conductors 8 and the signal conductors 9 so that the respective grounding conductors 8 are on the outside of the respective signal conductors 9; two input terminals 2 that are connected to outermost circumferential parts of the respective signal conductors 9 and are respectively led from outer circumferential positions on the coil part 75; two output terminals 3 that are connected to the innermost circumferential parts of the respective signal conductors 9 and are respectively led from a central position of the coil part 75 on the opposite side to the lead position A of the input terminals 2 with the hollow H in between; and a grounding terminal 4 for grounding the outermost circumferential parts of the grounding conductors 8 that is led from an outer circumferential position of the coil part 75 located on an opposite side to the lead position A of the respective input terminals 2 with the lead position B of the respective output terminals 3 in between, it is possible to capacitatively couple the signal conductor 9a mainly with the grounding conductor 8a corresponding to the signal conductor 9a and to capacitatively couple the signal conductor 9b mainly with the grounding conductor 8b corresponding to the signal conductor 9b. This means that it is possible to decrease the coupled capacitance of the signal conductor 9a and the grounding conductor 8b and the coupled capacitance of the signal conductor 9b and the grounding conductor 8a. By connecting the grounding conductors 8 at only one end, the degree of capacitative coupling between one signal conductor 9a and the other signal conductor 9b via the grounding conductor 8 can be reduced, and as a result, a common mode filter element with superior attenuation characteristics for common mode noise can be realized.

Also, according to the filter element 71, by disposing the respective signal conductors 9 in parallel so as to face only the respectively corresponding grounding conductors 8, the capacitative coupling of one signal conductor 9a with the grounding conductor 8b corresponding to the other signal conductor 9b and the capacitative coupling of the other signal conductor 9b with the grounding conductor 8a corresponding to the signal conductor 9a can both be significantly reduced. As capacitative coupling of one signal conductor 9a with the other signal conductor 9b via the respective grounding conductors 8 can be avoided more reliably, it is possible to realize a common mode filter element with even more superior attenuation characteristics.

In addition, according to the filter element 71, the respective signal conductors 9 are formed narrower than the corresponding grounding conductors 8 and are disposed at positions within the widths of the grounding conductors 8, so that it is possible to place the grounding conductors 8 between the respective signal conductors 9 in the wound state. As the grounding conductors 8 have a shielding effect, mutual interference for the signals propagated in the signal conductors 9 can be reduced, and as a result it is possible to realize a common mode filter element with even more superior attenuation characteristics.

Figure 24:
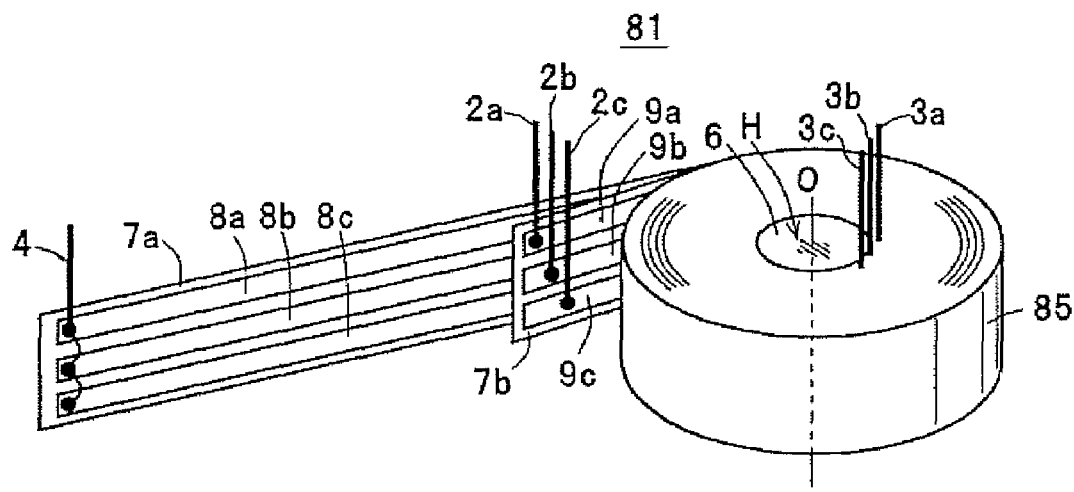
FIG. 24 is a perspective view of a filter element in a state where first end parts of belt-like insulators, grounding conductors, and signal conductors have been unwound to show the construction of the filter element according to a sixth embodiment of the present invention.

It should be noted that the present embodiment is not limited to the above construction. For example, as shown in FIG. 20 and FIG. 22, although an example construction of a common mode filter element for a two-phase transmission line that uses a coil part 75 with two grounding conductors 8 and two signal conductors 9 has been described above for the filter element 71, it is also possible to construct a common mode filter element using a coil part constructed with three or more grounding conductors 8 and signal conductors 9. For example, a filter element 81 (a filter element according to a sixth embodiment of the present invention) shown in FIG. 24 includes a coil part 85 constructed using three grounding conductors 8a, 8b, 8c (hereinafter referred to as the "grounding conductors 8" when no distinction is required) and three signal conductors 9a, 9b, 9c (hereinafter referred to as the "signal conductors 9" when no distinction is required), and is constructed as a common mode filter element for a three-phase transmission line. In the filter element 81, as shown in FIG. 24, the respective grounding conductors 8 are connected to each other at a first end (the winding end-side), with this first end being connected to a single grounding terminal 4. The respective signal conductors 9a, 9b, 9c have first ends (winding end-side) respectively electrically connected to ends of the respective input terminals 2a, 2b, 2c (hereinafter referred to as the "input terminals 2" when no distinction is required) and second ends (the winding start-side) respectively electrically connected to ends of the respective output terminals 3a, 3b, 3c (hereinafter referred to as the "output terminals 3" when no distinction is required) In the same way as in the filter element 71, the respective input terminals 2, the respective output terminals 3, and the grounding terminal 4 are respectively led from the lead positions A, B, C shown in FIG. 21. It should be noted that component parts that are the same as in the filter element 71 are designated by the same reference numerals and duplicated description thereof is omitted.

Figure 25:
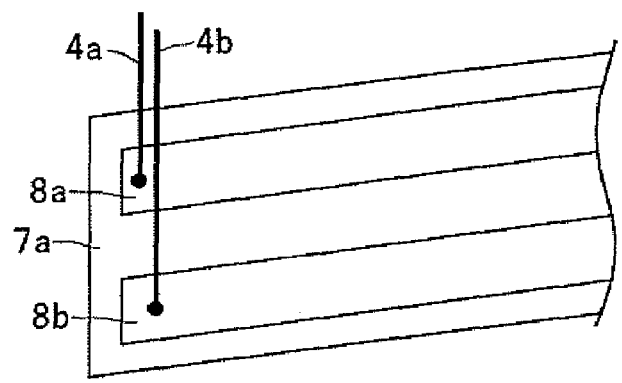
FIG. 25 is an enlarged view of first end parts of the respective grounding conductors showing another construction for attaching the grounding terminal to the respective grounding conductors.

Also, in the filter elements 71, 81 described above, as shown in FIG. 22 and FIG. 24, an example has been described where the respective grounding conductors 8 are connected to each other at one end (the winding end-side)

and this one end is connected to a single grounding terminal 4, but it is possible to use a construction where ends (the ends at the winding end) of the respective grounding conductors 8 are separately connected to ends of separate grounding terminals 4. For the filter element 71 as an example, as shown in FIG. 25, one end (the winding end-side) of the respective grounding conductors 8 can be connected to ends of grounding terminals 4a, 4b. Also, for the filter elements 71, 81 described above, as shown in FIG. 20 and FIG. 24, a construction is used where the respective input terminals 2, the respective output terminals 3, and the grounding terminal 4 are arranged on only one end surface (the upper end surface in the drawings) of the coil parts 75, 85, but it is sufficient to dispose the respective input terminals 2, the respective output terminals 3, and the grounding terminal 4 on the plane L that includes the center axis O of the coil part, so that a construction where some terminals out of the respective input terminals 2, the respective output terminals 3, and the grounding terminal 4 are disposed on the opposite end surface (the lower end surface in the drawings) to the other terminals can be used. Also, for the filter elements 71, 81, although preferred examples where the respective signal conductors 9 are formed narrower than the corresponding grounding conductors 8 and are disposed so as to be positioned within the widths of the grounding conductors 8 have been described, the signal conductors 9 may be disposed so as to slightly protrude out of the widths of the corresponding grounding conductors 8, and the respective signal conductors 9 may be formed wider than the corresponding grounding conductors 8. Also, for the filter elements 71, 81 described above, although examples where the magnetic core 6 are attached inside the hollows H in the coil parts 75, 85 have been described, it is possible to construct the coil parts 75, 85 as air-core coils without attaching the magnetic core 6.

Figure 26:
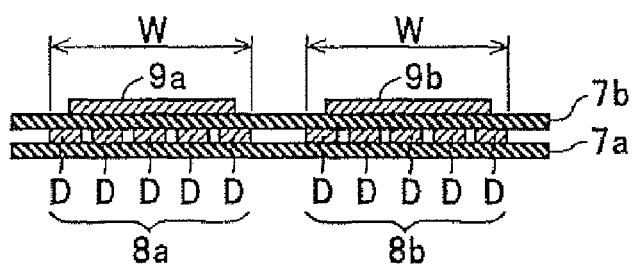
FIG. 26 is a cross-sectional view taken in the width direction of the respective belt-like insulators, grounding belt-like conductors, and signal transmitting belt-like conductors showing another construction of the grounding belt-like conductors.

In addition, for the filter elements 71, 81 described above, although examples where the respective grounding conductors 8a, 8b corresponding to the respective signal conductors 9a, 9b are constructed of single belt-like conductors have been described, as shown in FIG. 26, it is possible to construct the respective grounding conductors 8a, 8b from a plurality of belt-like conductors D. Also, for the filter elements 71, 81 described above, examples where the same number of grounding conductors 8 as the signal conductors 9 are disposed have been described, but it is also possible to dispose a higher number of grounding conductors 8 than signal conductors 9.

Seventh Embodiment

Figure 27:
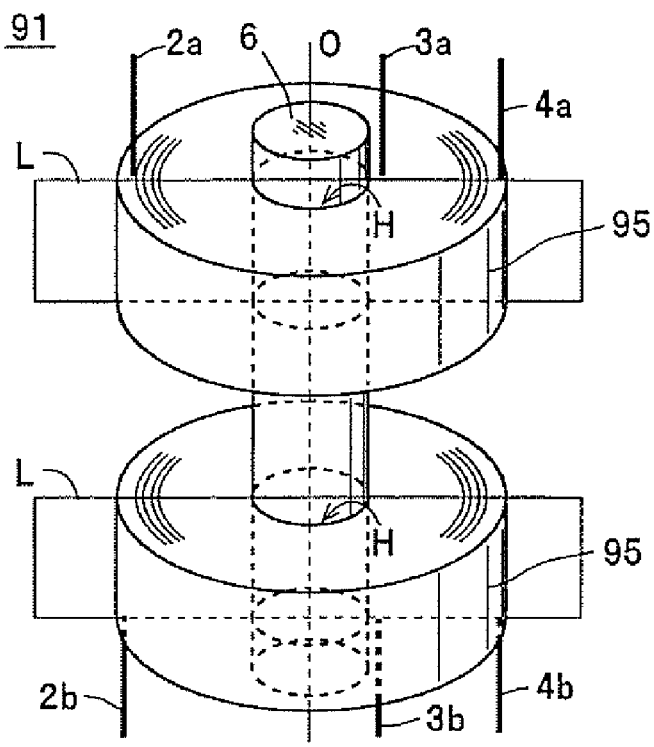
FIG. 27 is a perspective view showing the construction of a filter element according to a seventh embodiment of the present invention.
Figure 28:
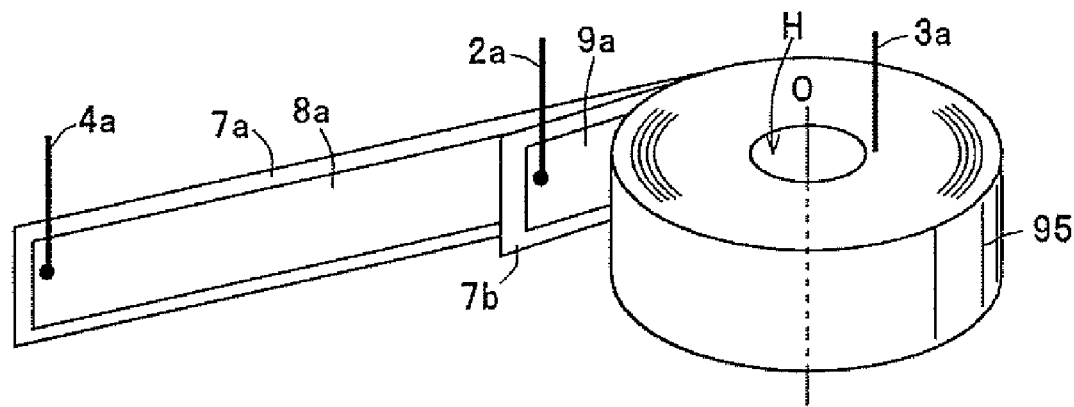
FIG. 28 is a perspective view of a coil part in a state where first end parts of the belt-like insulators, the grounding belt-like conductor, and the signal transmitting belt-like conductor have been unwound to show the construction of coil parts of the filter element shown in FIG. 27.

Although the filter elements 71, 81 have been described using examples including the coil parts 75, 85 constructed so that the respective grounding conductors 8 are disposed in parallel on a single belt-like insulator 7a and the respective signal conductors 9 are disposed in parallel on a single belt-like insulator 7b, in the same way as a filter element 91 shown in FIG. 27, it is also possible to construct a filter element that uses a plurality (as one example, two)of coil parts 95 constructed so that as shown in FIG. 28, a single grounding conductor 8a is disposed on a single belt-like insulator 7a and a single signal conductor 9a is disposed on a single belt-like insulator 7b, with the plurality of coil parts 95 being magnetically coupled to each other via the magnetic core 6. In this case, the respective winding directions of the grounding conductors 8 and the signal conductors 9 that construct the respective coil parts 95 with respect to the magnetic core 6 are set as the same direction. In addition, in the same way as the filter element 71, the respective input terminals 2a, 2b, the respective output terminals 3a, 3b, and the respective grounding terminals 4a, 4b are respectively connected to a first end of the signal conductors 9 in the coil parts 95, a second end of the signal conductors 9, and a first end of the grounding conductor 8, and are respectively led from the lead positions A, B, C shown in FIG. 21. Also, in the filter element 91 shown in FIG. 27, as one example, the respective input terminals 2a, 2b, the respective output terminals 3a, 3b, and the respective grounding terminals 4a, 4b are disposed on the upper surface of the upper coil part 95 in FIG. 27 and on the lower surface of the lower coil part 95 in FIG. 27. It should be noted that component parts that are the same as the filter element 71 are designated by the same reference numerals and duplicated description thereof is omitted.

In this filter element 91, by using two independent coil parts 95, it is possible to reduce both the coupled capacitance of the signal conductor 9 of one coil part 95 with the grounding conductor 8 of the other coil part 95 and the coupled capacitance of the grounding conductor 8 of the one coil part 95 with the signal conductor 9 of the other coil part 95. Accordingly, in the same way as the filter element 71, it is possible to reduce the coupled capacitance between the signal conductors 9 of the respective coil parts 95, and as a result a common mode filter element that has superior attenuation characteristics for common mode noise can be realized. Also, by combining a plurality of coil parts 95 of the same type, it is possible to easily realize a common mode filter element for a multi-phase transmission line with two, three, or more phases.

In addition, as shown in FIG. 27, although an example where two coil parts 95 are magnetically coupled via the magnetic core 6 has been described above for the filter element 91, a CI core, an EI core or a troidal core can be used in place of the cylindrical magnetic core 6 shown in FIG. 27. It is also possible to use a construction where the magnetic core 6 is removed and the respective coil parts 95 are disposed close to one another in a state where the respective center axes O are aligned. By disposing the coil parts 95 close to one another, the respective coil parts 95, 95 can be magnetically coupled even in an air core state, so that in the same way as the filter element 91 described above, it is possible to realize a common mode filter element with superior attenuation characteristics for common mode noise.

Eighth Embodiment

The filter elements 71, 81, 91 are described above using examples where the grounding conductors 8 are disposed on the outside of the signal conductors 9 in the coil parts 75, 85, 95, but the filter elements can also be constructed with coil parts where the grounding conductors 8 are disposed inside the signal conductors 9. As one example, a filter element 101 including a coil part 105 composed of the same component parts as the coil part 75 of the filter element 71 but with the grounding conductor 8 disposed inside the signal conductor 9 will be described with reference to FIG. 29 and FIG. 30. It should be noted that component parts that are the same as the filter element 71 are designated by the same reference numerals and duplicated description thereof has been omitted.

Figure 29:
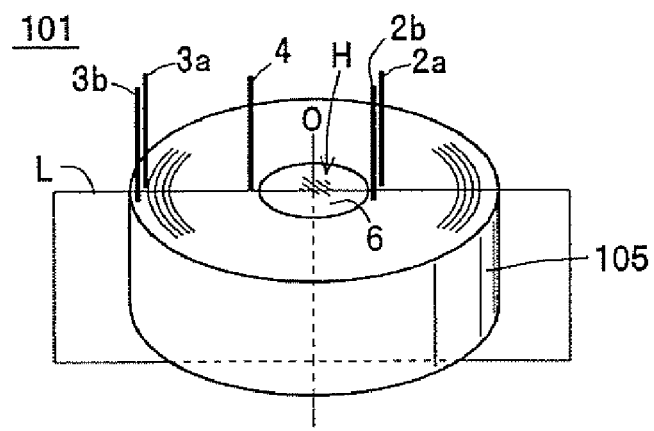
FIG. 29 is a perspective view showing the construction of a filter element according to an eighth embodiment of the present invention.
Figure 30:
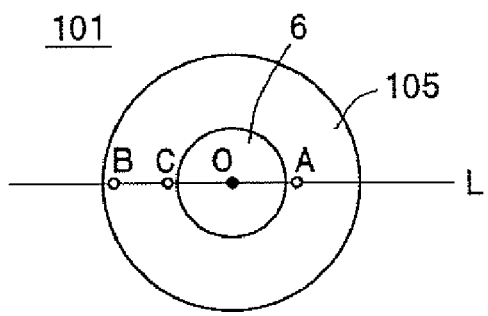
FIG. 30 is a plan view showing the leading positions of the input terminal, the output terminal, and the grounding terminal when looking from one end surface of the filter element shown in FIG. 29.

The coil part 105 is formed as shown in FIG. 29 in the overall shape of a tube (a round cylinder with a hollow H formed in a center) by winding the respective belt-like insulators 7, the respective grounding conductors 8, and the signal conductors 9 that have been placed on top of each other with a first end of the conductors 8, 9 as the winding start so that the respective grounding conductors 8 are disposed inside the respective signal conductors 9. The magnetic core 6 is attached inside the hollow H. In this case, the first ends of the respective signal conductors 9 to which the respective input terminals 2 are connected (the innermost circumferential part or "inner circumference part" for the present invention) is positioned in the center (the inner circumference) of the coil part 75, and as shown in FIG. 29, the respective input terminals 2 are respectively led from a central (inner circumference) position (the lead position A in FIG. 30) on one end surface (the upper end surface in FIG. 29) of the coil part 75. The first end of the respective grounding conductors 8 to which the grounding terminal 4 is connected (the innermost circumferential part or "inner circumference part" for the present invention) is positioned in the center (the inner circumference) of the coil part 75, and as shown in FIG. 29, the grounding terminal 4 is led from a central (inner circumference) position (the lead position C in FIG. 30) on one end surface of the coil part 75. Here, as shown in FIG. 30, the lead position C of the grounding terminal 4 lies on a plane L including the central axis O of the coil part 75 and the lead position A of the input terminal 2, and is set on an opposite side to the lead position A with the central axis O (the hollow H, or in other words, the magnetic core 6) in between. On the other hand, the second ends (the innermost circumferential parts or "inner circumference parts" for the present invention) of the signal conductors 9 to which the output terminals 3 are connected are positioned at the outer circumference of the coil part 75 and, as shown in FIG. 29, the output terminals 3 are respectively led from an outer circumference position (the lead position B in FIG. 30) on one side surface of the coil part 75. More specifically, as shown in FIG. 30, the lead position B of the respective output terminals 3 are set on the plane L on an opposite side to the lead position A with the lead position C in between. With this filter element 101, in the same way as the filter element 71 described above, it is possible to realize a common mode filter element with superior attenuation characteristics for common mode noise. It should be noted that a construction where the respective grounding conductors 8 are wound so as to be inside the respective signal conductors 9 and the respective input terminal 2, the grounding terminal 4, and the respective output terminal 3 are led from the positions shown in FIG. 30 can naturally also be applied to the filter element 81 and the filter element 91.

More specifically, the present invention will be described in detail by way of a specific embodiment. As one example, a specific embodiment is described for the filter element 71.

Insulating sheets that are made of polyimide and are 1.7 cm wide, 35 μm thick, and 150 cm long were used as the respective belt-like conductors 7, thin metal plates that are made of copper and are 0.50 cm wide, 35 μm thick, and 150 cm long were used as the respective grounding conductors 8, and thin metal plates that are made of copper and are 0.45 cm wide, 35 μm thick, and 150 cm long were used as the respective signal conductors 9. By winding these members in a layered state thirty-five times around a circular pillar-shaped magnetic core 6, a sample filter element where the respective signal conductors 9 have an inductance of 8 mH at 10 kHz was fabricated and set as the specific embodiment. A sample filter element that uses one thin metal plate that is made of copper and is 1.5 cm wide, 35 μm thick, and 150 cm long in place of the respective grounding conductors 8 used in the above specific embodiment was also fabricated and set as a comparative example.

Next, the noise attenuation characteristics were measured for the filter elements according to the specific embodiment and the comparative example. For example, the power supply terminal interference voltage characteristics in a state where the respective filter elements are attached to a power supply line of an electronic appliance as one example of a transmission line were measured using a measurement method for a noise standard. The power supply terminal interference voltage characteristics (noise attenuation characteristics) measured for states where the filter elements of the specific embodiment and the comparative example were attached are respectively shown in FIG. 31 and FIG. 32.

Figure 31:
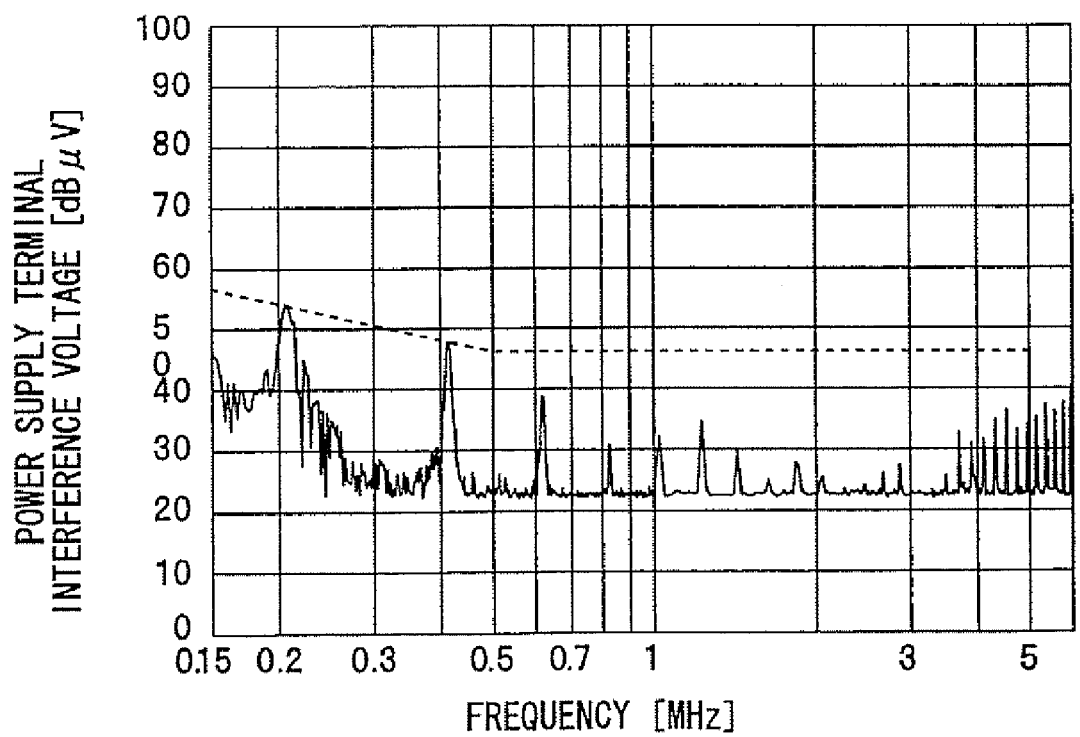
FIG. 31 is a power supply terminal interference voltage characteristics graph showing the relationship between frequency and power supply terminal interference voltage for a filter element of a specific embodiment.
Figure 32:
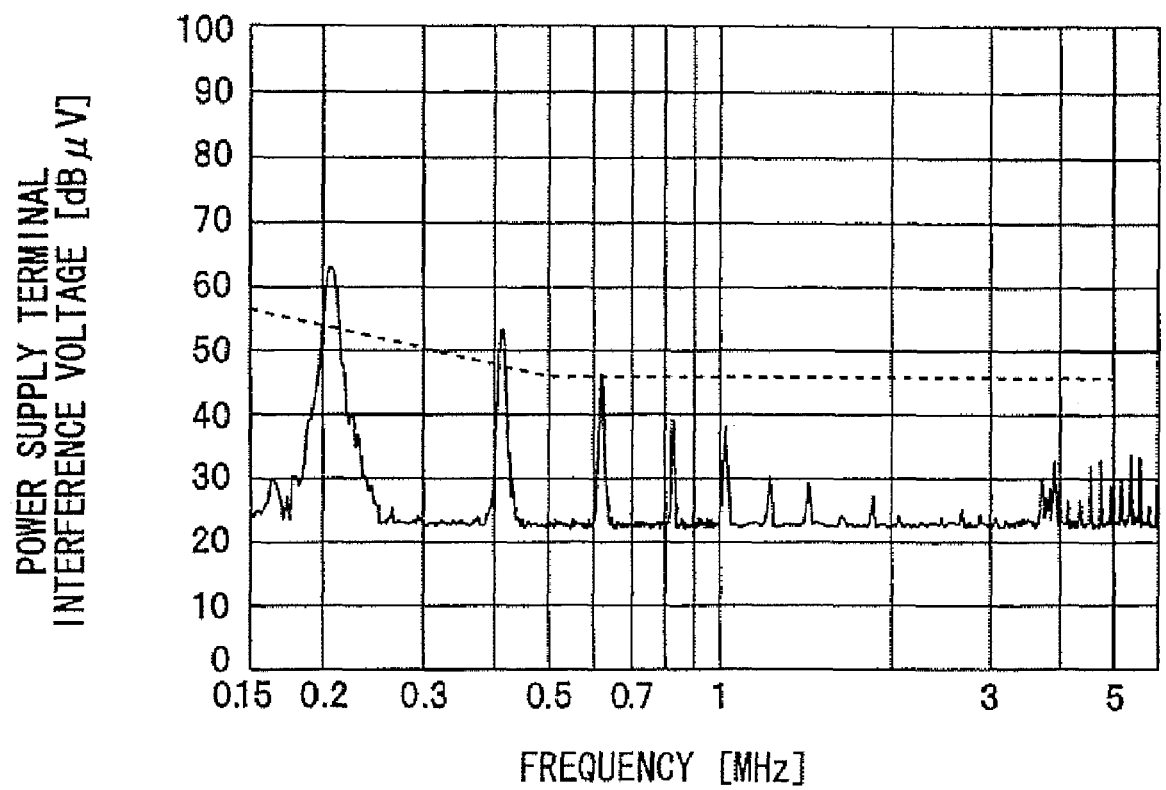
FIG. 32 is a power supply terminal interference voltage characteristics graph showing the relationship between frequency and power supply terminal interference voltage for a filter element of a comparative example.
Figure 33:
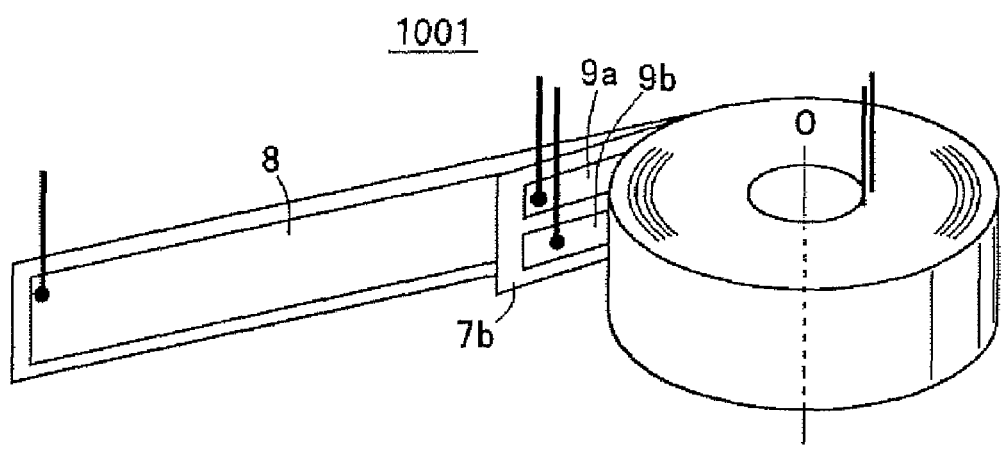
FIG. 33 is a perspective view of a filter element in a state where first end parts of the respective belt-like insulators, the grounding belt-like conductor, and the respective signal transmitting belt-like conductors have been unwound to show the construction of a filter element that has already been developed by the inventors.

According to the respective power supply terminal interference voltage characteristics shown in FIG. 31 and FIG. 32, as shown in FIG. 32, when the filter element according to the comparative example is attached, a value limit (shown by the broken line in the drawing) for class B (average value) in the standard for the power supply terminal interference voltage is exceeded by up to around 10 dB μV. On the other hand, when the filter element according to the specific embodiment is attached, as shown in FIG. 31, the power supply terminal interference voltage is suppressed to within the value limit (shown by the broken line in the drawing).

Ninth Embodiment

Figure 34:
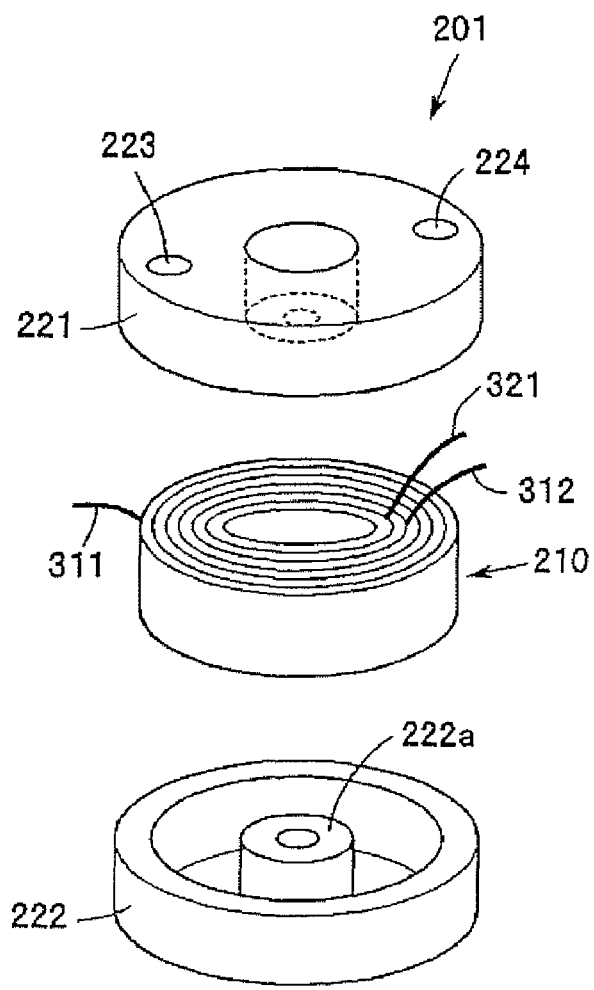
FIG. 34 is an exploded perspective view showing a filter element according to a ninth embodiment of the present invention.
Figure 35:
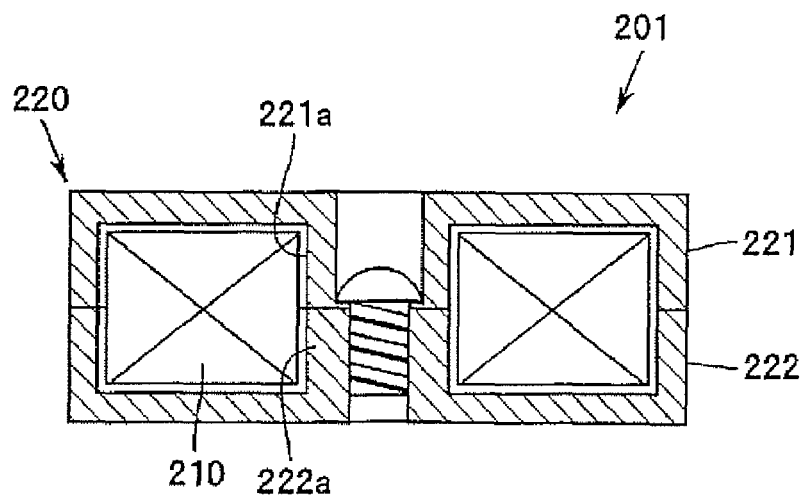
FIG. 35 is a cross-sectional view of the filter element shown in FIG. 34.

FIG. 34 is an exploded perspective view of a filter element 201 according to a ninth embodiment of the invention, while FIG. 35 is a cross-sectional view of the filter element 201. As fundamental component parts, the filter element 201 includes a coil 210 and a magnetic core 220 in which the coil 210 is enclosed. Here, the coil 210 according to the present embodiment corresponds to the coil part 5 and the like of the filter element 1 and the like described above.

Figure 36:
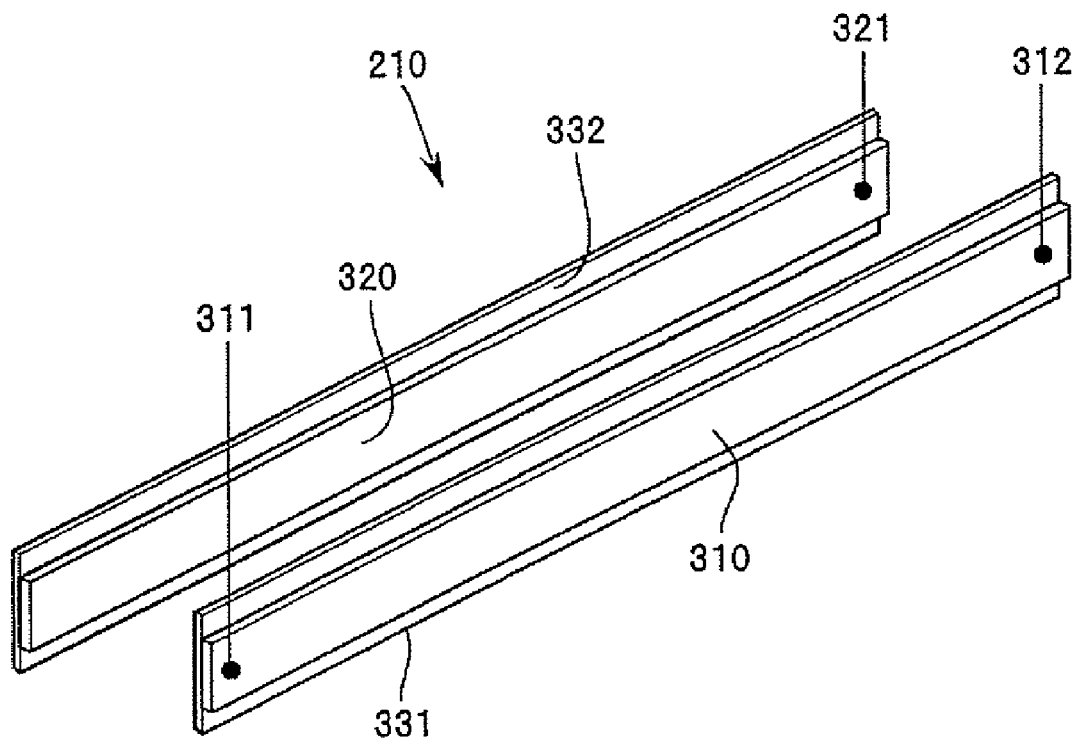
FIG. 36 is a perspective view of an unwound coil included in the filter element of FIG. 34.

FIG. 36 is a perspective view schematically showing the coil 210 in an unwound state. In this diagram, the coil 210 includes a signal transmission line 310 formed in a belt-like shape, a grounding line 320 formed in the same belt-like shape, and a pair of tape-like insulators 331, 332. Here, the signal transmission line 310, the grounding line 320, and the tape-like insulators 331, 332 in the present embodiment respectively correspond to the signal conductor 9, the grounding conductor 8, and the belt-like insulators 7a, 7b of the filter element 1 and the like described above. In this case, a conductive material such as copper foil or aluminum foil is used for the signal transmission line 310 and the grounding line 320, and a dielectric insulator that exhibits favorable frequency characteristics, such as polyimide resin film or polyethylene is suited to use as the tape-like insulators 331, 332.

It should be noted that it is also possible to form the signal transmission line 310 and the grounding line 320 directly on the tape-like insulators 331, 332 by vapor deposition or plating, for example. It should be obvious that the widths of the tape-like insulators 331, 332 are wider than the respective widths of the signal transmission line 310 and the grounding line 320.

In this example, the filter element 201 is a normal mode noise filter with one signal transmission line 310, but by using a plurality of signal transmission lines 310, it is possible to make the filter element 201 a common mode noise filter.

The two ends of the signal transmission line 310 are connected to a signal input lead terminal 311 and a signal output lead terminal 312. One end of the grounding line 320 is connected to a grounding lead terminal 321. Here, the signal input lead terminal 311, the signal output lead terminal 312, and the grounding lead terminal 321 of the present embodiment correspond to the input terminal 2, the output terminal 3, and the grounding terminal 4 of the filter element 1 and the like described above. The connection positions of these lead terminals are described later, but the respective lead terminals 311, 312, 321 may be pin-shaped, wire-shaped, or foil-shaped and the wire diameters and the like can be freely selected. Soldering, conductive adhesive, and the like are normally used as the connecting means, but in some cases wires can be integrally led from the lead terminals.

As one example, the coil 210 is obtained by layering one of the tape-like insulators 332, the grounding line 320, the other tape-like insulator 331, and the signal transmission line 310 in that order and winding the layered members in a spiral. It should be noted that although separate lead terminals are normally attached to the signal transmission line 310 and the grounding line 320 before winding, it is also possible to attach the lead terminals after winding.

In this example, the magnetic core 220 is formed as a circular tube-shaped pot-type magnetic core. Ferrite is favorably used as the material. The pot-type magnetic core 220 is split into an upper core 221 and a lower core 222, with two lead exit parts (exit holes) 223, 224 for leading the lead terminals connected to the coil 210 to the outside being formed in the upper core 221.

Center cores 221a, 222a that are inserted into a center of the coil 210 are provided at respective centers of the upper core 221 and the lower core 222. The center cores 221a, 222a include a screw hole and are integrally fixed by screwing a male-threaded screw in this screw holes after assembly.

In the present inventions when the coil 210 is fabricated, according to whether the members are wound so that the signal transmission line 310 is inside the grounding line 320 or outside the grounding line 320, the connection positions of the signal input lead terminal 311 and the signal output lead terminal 312 are interchanged. This is shown in FIG. 37A and 37B, with the tape-like insulators 331, 332 having been omitted from these drawings.

Figure 37A:
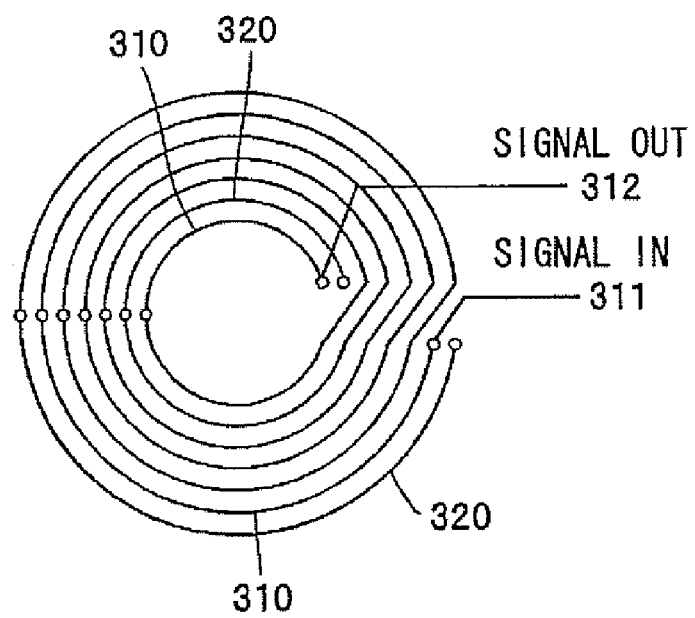
FIG. 37A is a plan view schematically showing a winding example of the coil for the filter element shown in FIG. 34.

FIG. 37A shows the case where the coil 210 is wound with the signal transmission line 310 on the inside and the grounding line 320 on the outside, and in this case, the signal input lead terminal 311 is connected to the outermost circumference of the signal transmission line 310 and the signal output lead terminal 312 is connected to the innermost circumference of the signal transmission line 310.

Figure 37B:
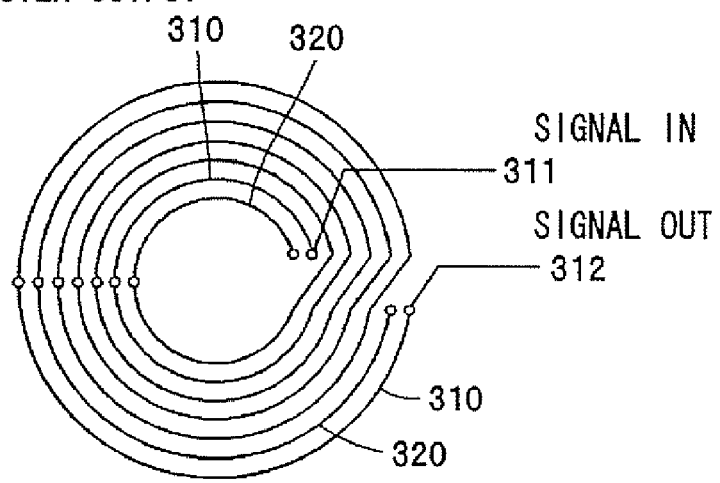
FIG. 37B is a plan view schematically showing another winding example of the coil in the filter element shown in FIG. 34.

FIG. 37B shows the case where the coil 210 is wound with the signal transmission line 310 on the outside and the grounding line 320 on the inside, and in this case, as the opposite to FIG. 37A, the signal input lead terminal 311 is connected to the innermost circumference of the signal transmission line 310 and the signal output lead terminal 312 is connected to the outermost circumference of the signal transmission line 310.

With the above as a premise, the connection position of the grounding lead terminal 321 with respect to the grounding line 320 will be described with reference to FIG. 38A and FIG. 38B. First, the connection position of the grounding lead terminal 321 in the case where the coil 210 has been wound with the signal transmission line 310 on the inside and the grounding line 320 on the outside as shown in FIG. 37A will be described with reference to FIG. 38A.

In this case, as described above, the signal input lead terminal 311 is connected to the outermost circumference of the signal transmission line 310, and the grounding line 320 that is adjacent on the inside of the outermost circumferential part of the signal transmission line 310 is extended by up to one turn on the outer circumference from the connection position of the signal input lead terminal 311 and the grounding lead terminal 321 is connected to a predetermined position within this extension 320a.

Figure 38A:
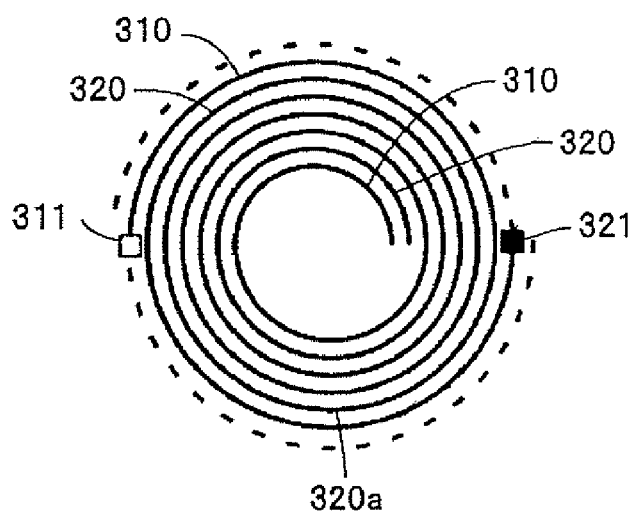
FIG. 38A is a schematic diagram useful in explaining connection positions of a signal input lead terminal and a grounding lead terminal for the coil in the filter element of FIG. 34.

In the example in FIG. 38A, the grounding line 320 that is adjacent on the inside of the outermost circumferential part of the signal transmission line 310 is extended by around one half turn from the connection position of the signal input lead terminal 311 and the grounding lead terminal 321 is connected to the end of this extension 320a.

Next, the connection position of the grounding lead terminal 321 in the case where the coil 210 is wound with the signal transmission line 310 on the outside and the grounding line 320 on the inside as shown in FIG. 37B will be described with reference to FIG. 38B.

In this case, as described above, the signal input lead terminal 311 is connected to the innermost circumference of the signal transmission line 310, but the grounding line 320 that is adjacent on the outside of the innermost circumferential part of the signal transmission line 310 is extended by up to one turn on the inner circumference from the connection position of the signal input lead terminal 311 and the grounding lead terminal 321 is connected to a predetermined position within this extension 320b.

Figure 38B:
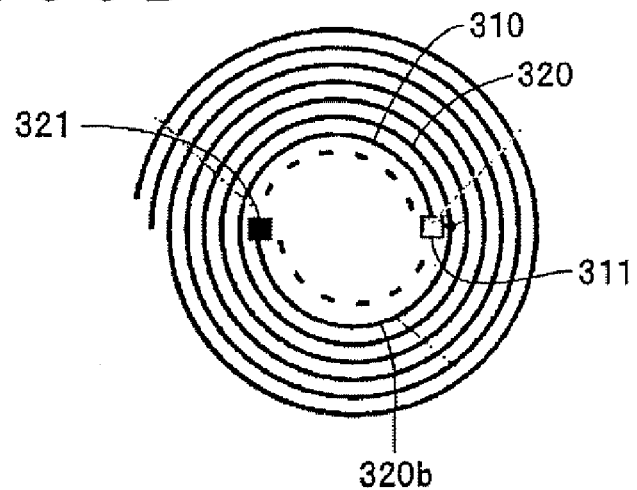
FIG. 38B is a schematic diagram useful in explaining another connection positions of the signal input lead terminal and the grounding lead terminal for the coil in the filter element of FIG. 34.

In the example in FIG. 38B, the grounding line 320 that is adjacent on the outside of the innermost circumferential part of the signal transmission line 310 is extended by around one half turn from the connection position of the signal input lead terminal 311 and the grounding lead terminal 321 is connected to the end of this extension 320b.

It should be noted that it is not necessary for the connection positions of the signal input lead terminal 311 and the signal output lead terminal 312 to be located at the physical ends of the signal transmission line 310. That is, the connection positions of the signal input lead terminal 311 and the signal output lead terminal 312 do not need to be what are effectively the ends of the signal transmission line 310. Putting this another way, the "outermost circumferential part" and "innermost circumferential part" of the signal transmission line 310 are at or near both ends of a part that functions as a filter. This is also the case for the grounding lead terminal 321.

As shown in FIG. 34, in the present invention, after the signal input lead terminal 311 and the grounding lead terminal 321 have been connected to the above predetermined positions, it is important to lead the terminals separately from the different lead exit parts to an outside of the magnetic core 220. For example, if the signal input lead terminal 311 is led from one of the lead exit parts 223, the grounding lead terminal 321 will definitely be led from the other lead exit parts 224.

It should be noted that the signal output lead terminal 312 is not subject to a limitation such as that described above and may be led together with the grounding lead terminal 321 from the lead exit part 224 or may be led together with the signal input lead terminal 311 from the lead exit part 223, or the signal output lead terminal 312 may be led from another lead exit part provided separately.

When, as one example, the coil 210 is enclosed in the pot-type magnetic core 220, in a case where the positions of the signal input lead terminal 311 and the signal output lead terminal 312 are displaced, the signal input lead terminal 311 can be extended around an inside of the magnetic core 220 towards the position of the lead exit part 223 subject to the following condition.

Figure 39A:
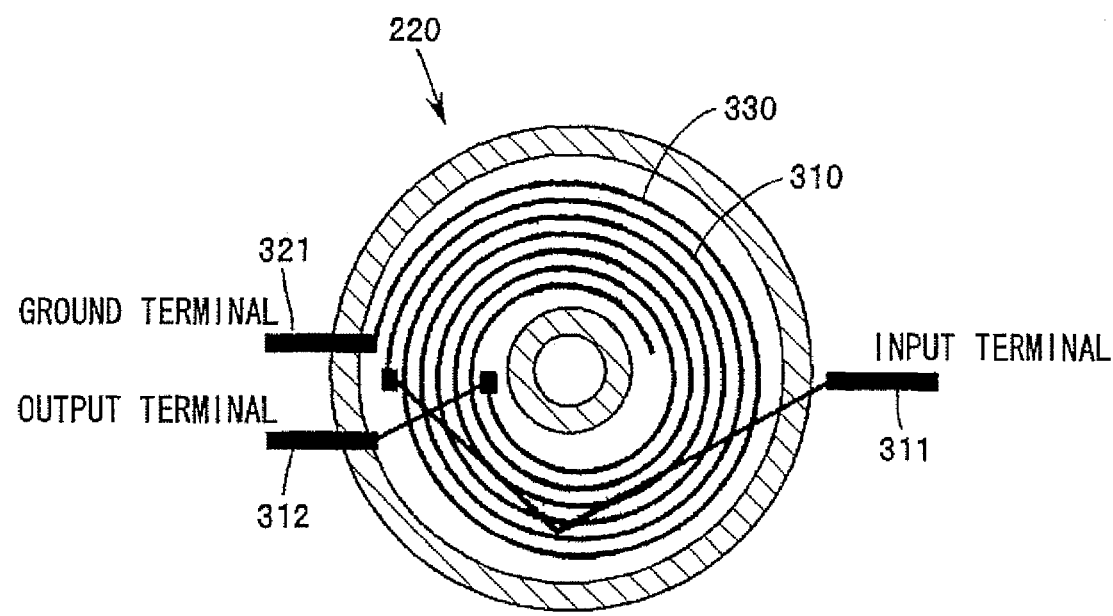
FIG. 39A is a schematic diagram showing an example where the signal input lead terminal is extended inside a magnetic core according to the present invention.

The condition is that as shown in FIG. 39A, the direction in which the signal input lead terminal 311 is extended is the same as the winding direction of the coil 210. For the present invention, setting the direction in which the signal input lead terminal 311 is extended at the opposite direction to the winding direction of the coil 210 as in FIG. 40A is prohibited.

Figure 39B:
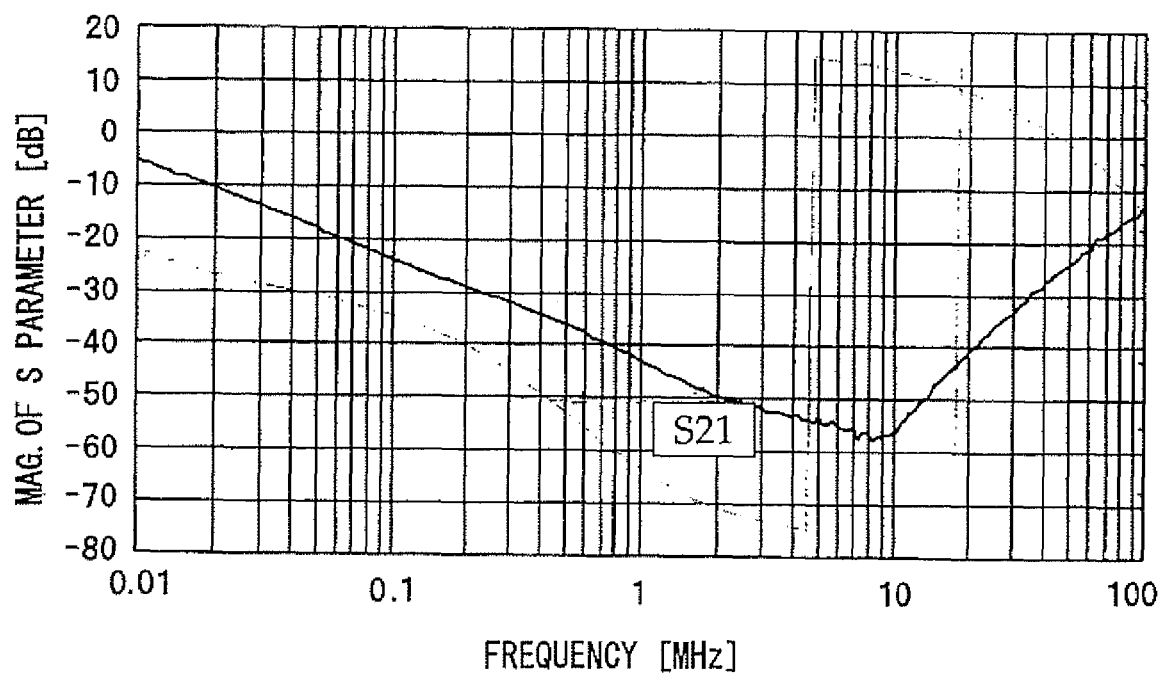
FIG. 39B is a graph showing the attenuation characteristics for the construction shown in FIG. 39A.
Figure 40A:
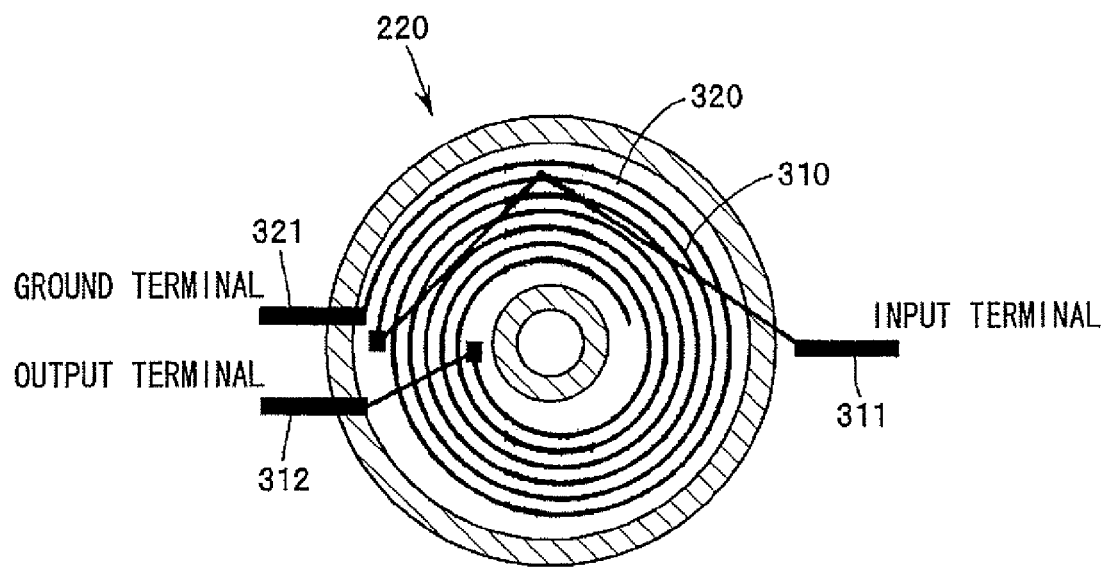
FIG. 40A is a schematic diagram showing an example where the signal input lead terminal is extended inside a magnetic core contrary to the present invention.
Figure 40B:
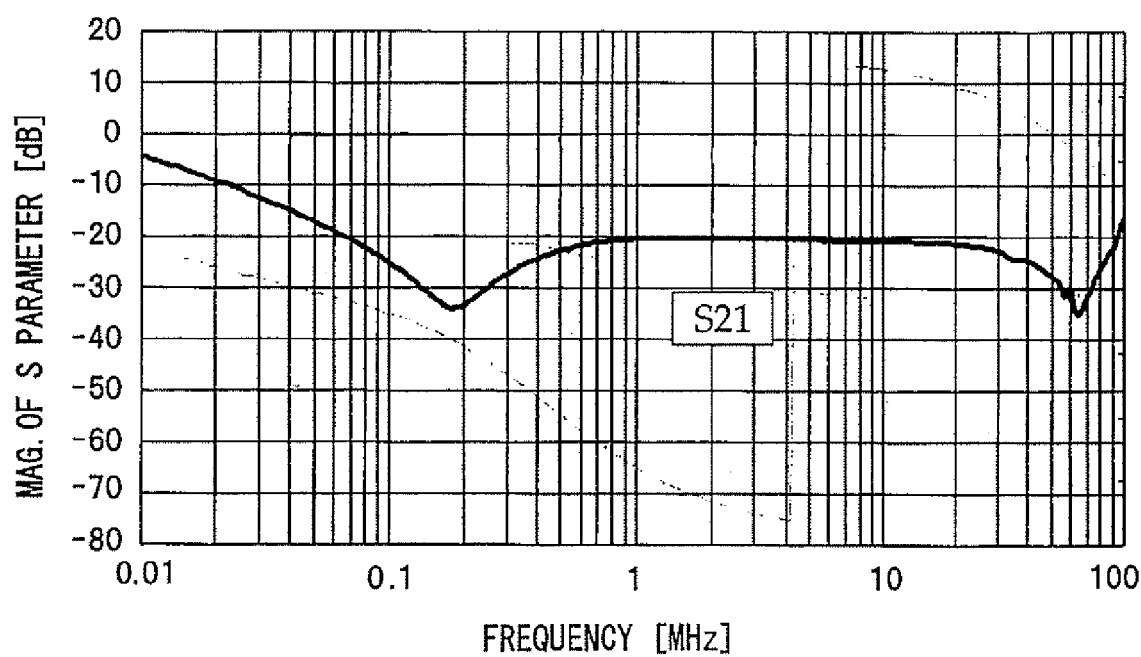
FIG. 40B is a graph showing the attenuation characteristics for the construction shown in FIG. 40A.

To verify this condition, FIG. 39B shows a characteristics graph of the S parameter when the signal input lead terminal 311 is extended in the winding direction of the coil 210 in accordance with the condition of the present invention as shown in FIG. 39A, and FIG. 40B shows a characteristics graph of the S parameter when the signal input lead terminal 311 is extended in violation to the condition of the present invention as shown in FIG. 40A. The difference in the attenuation characteristics is clearly shown in these graphs. It should be noted that the S parameter was measured for a 50Ω impedance using a HP8751A network analyzer made by AGILENT TECHNOLOGIES.

It should be noted that although the example in FIG. 39A is for the device shown in FIG. 383, as shown in FIG. 38A, the signal input lead terminal 311 can also be extended according to the above condition in a case where the signal input lead terminal 311 is connected to an outermost circumferential end of the signal transmission line 310.

For the present invention, the extension length of the signal input lead terminal 311 inside the magnetic circuit is preferably below 360° from the connecting position of the signal input lead terminal 311. It should be noted that when the signal output lead terminal 312 and the grounding lead terminal 321 are extended within the magnetic circuit, these terminals do not need to satisfy the condition like the signal input lead terminal 311 and can be freely extended.

Next, the magnetic core provided in the filter element 201 according to the present invention will be described. Aside from the pot-type magnetic core 220 shown in FIG. 34 and FIG. 35, the magnetic core referred to here includes a magnetic core 230 (hereinafter, "partitioned rectangular magnetic core") composed of a segmented core in the shape of a partitioned rectangle shown in FIG. 48A and 48B. The "partitioned rectangular core" (in other words, a figure-eight core) referred to here is composed using an EE core or an EI core, for example.

The present invention has two conditions. As a first condition, a magnetic circuit is provided where the magnetic cores 220, 230 are interlinked via the coil 210 that includes a center core that passes through the center of the coil 210. As a second condition, at least two independent lead exit parts are included, with the two lead exit parts being arranged at positions so that the magnetic characteristics of two paths (wiring paths) that pass on both sides of the center core are substantially equal.

FIG. 41 to FIG. 47 show various examples 220a to 220g of pot-type magnetic cores 220 to which the present invention can be applied. It should be noted that FIG. 41 to FIG. 47 each include a perspective view (an upper part) and a plan view (a lower part). The example pot-type magnetic cores 220a to 220g are all provided with the center cores 221a, 222a shown in FIG. 34, but for sake of convenience, the round holes drawn in the centers of the respective perspective views and plan views are set as the center cores CC.

Figure 41:
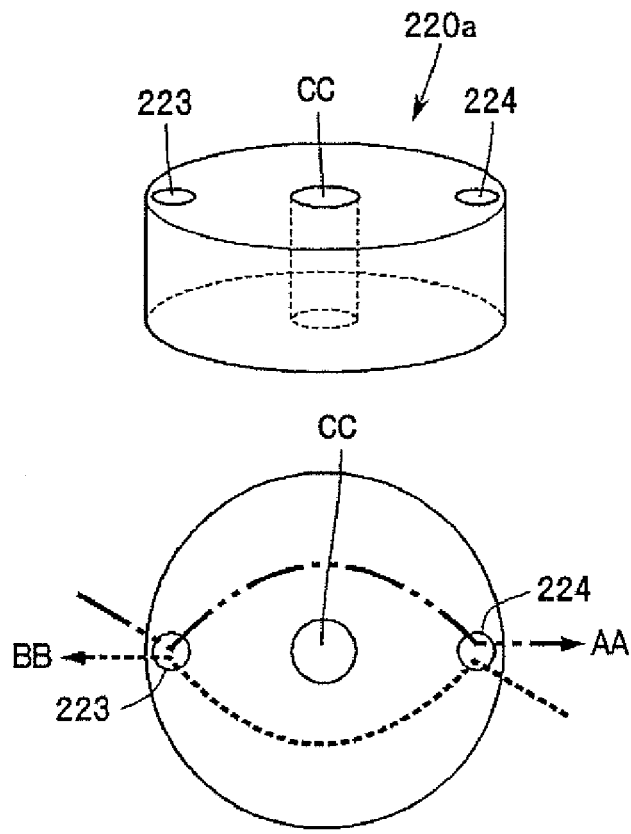
FIG. 41 is a perspective view and a plan view showing a first example of a pot-type magnetic core included in the filter element of FIG. 34.

The pot-type magnetic core 220a in FIG. 41 is the same as the core shown in FIG. 34 and includes two independent lead exit parts 223, 224. In this example, the lead exit parts 223, 224 are round holes of equal diameter and are disposed at positions that are symmetric with respect to the center of the center core CC. By doing so, as one example, it is possible to achieve substantially equal magnetic characteristics for a path AA from one (the first) lead exit part 223 via an upper side in the plan view (hereinafter simply the "upper side") of the center core CC to the other (the second) lead exit part 224 and a path BB from the second lead exit part 224 via a lower side in the plan view (hereinafter simply the "lower side") of the center core CC to the first lead exit part 223. As described above, the signal input lead terminal 311 and the grounding lead terminal 321 are definitely led from different lead exit parts.

Figure 42:
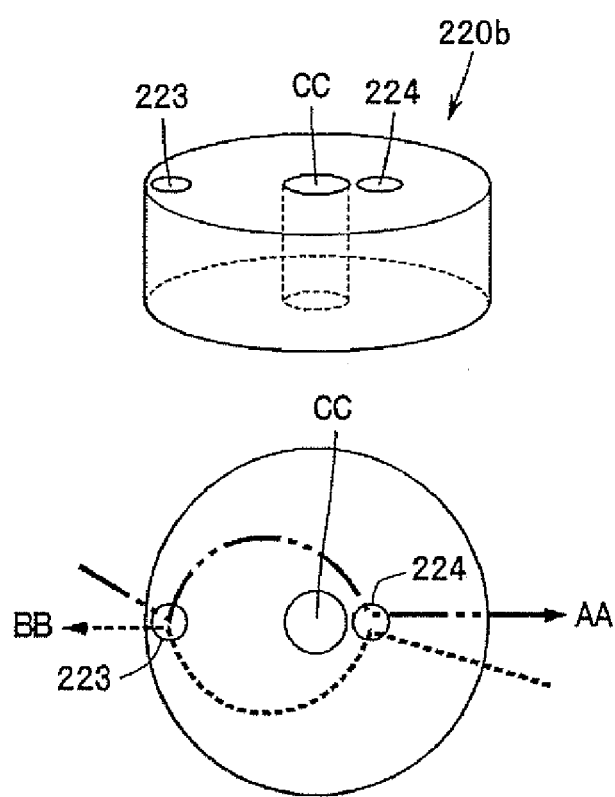
FIG. 42 is a perspective view and a plan view showing a second example of a pot-type magnetic core.

In the pot-type magnetic core 220b shown in FIG. 42, on a diameter line that passes the center core CC, the first lead exit part 223 and the second lead exit part 224 of the pot-type magnetic core 220a described above, the first lead exit part 223 is disposed at an outer circumferential part and the second lead exit part 224 is disposed at an inner circumferential part on an opposite side to the first lead exit part 223 with the center core CC in between. In this case also, the magnetic characteristics of the paths AA and BB described above can be made substantially equal.

Figure 43:
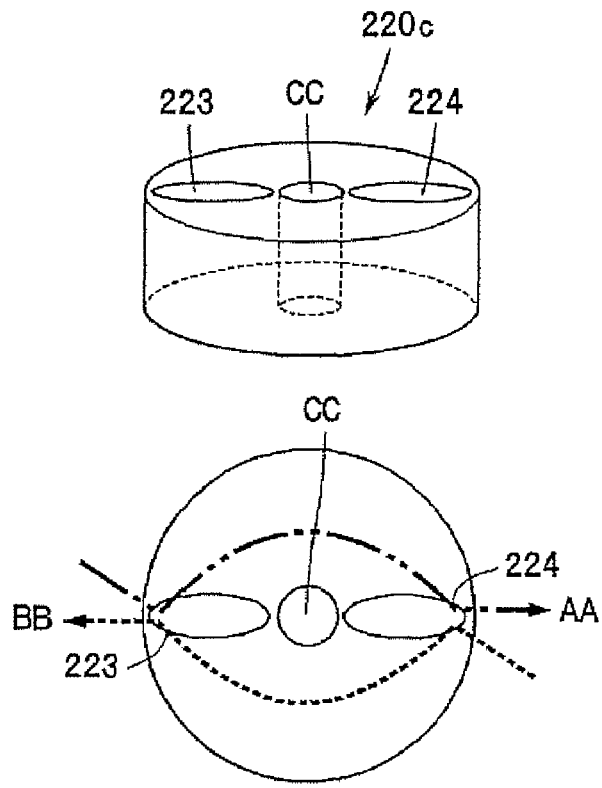
FIG. 43 is a perspective view and a plan view showing a third example of a pot-type magnetic core.
Figure 44:
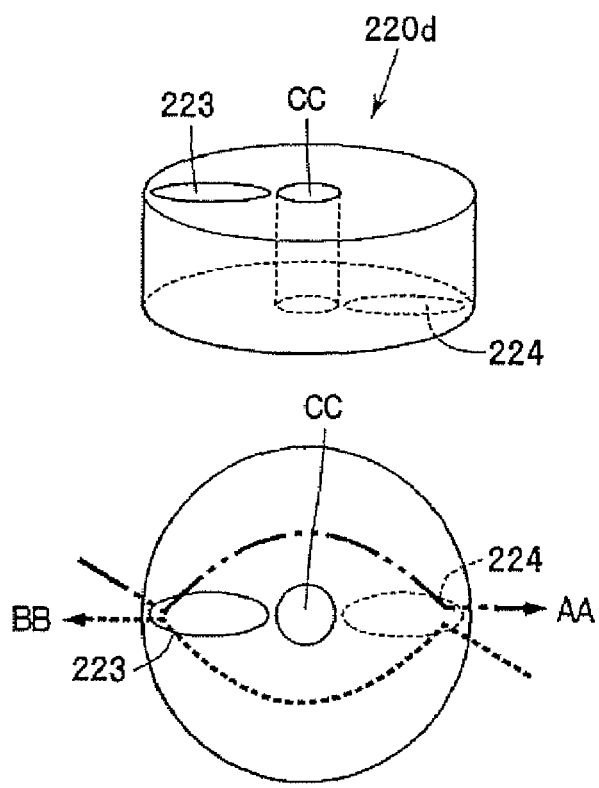
FIG. 44 is a perspective view and a plan view showing a fourth example of a pot-type magnetic core.

The pot-type magnetic core 220c shown in FIG. 43 is an example where the first lead exit part 223 and the second lead exit part 224 of the pot-type magnetic core 220a described above have both been formed as ovals of the same sizes and shapes. Also, the pot-type magnetic core 220d shown in FIG. 44 is an example where the first lead exit part 223, out of the two lead exit parts of the pot-type magnetic core 220c shown in FIG. 43, is disposed on an upper surface and the second lead exit part 224 is disposed on the lower surface. The first lead exit part 223 and the second lead exit part 224 may alternatively be round holes of the same diameter.

Figure 45:
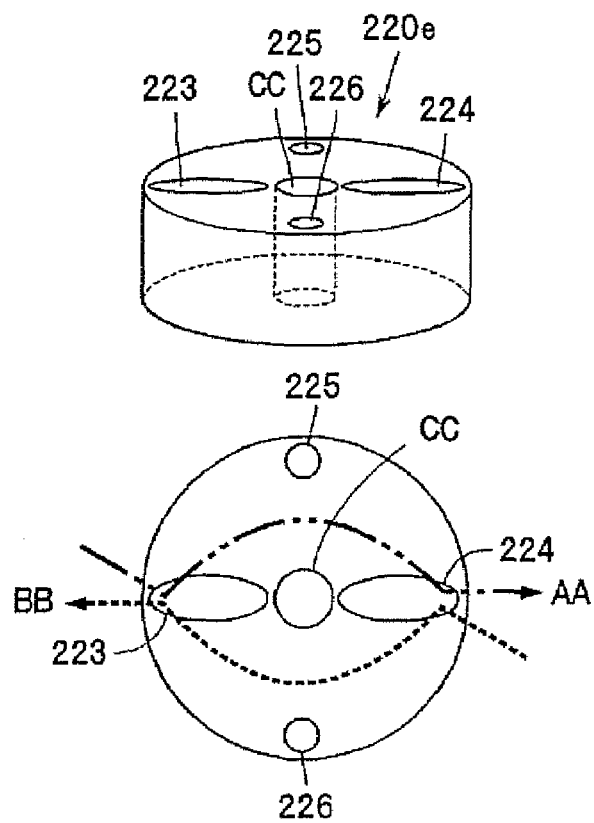
FIG. 45 is a perspective view and a plan view showing a fifth example of a pot-type magnetic core.

The pot-type magnetic core 220e shown in FIG. 45 is an example where in addition to the oval first and second lead exit parts 223, 224 of the pot-type magnetic core 220c shown in FIG. 43, third and fourth lead exit parts 225, 226 in the form of round holes have been added, so that there are a total of four lead exit parts. The third and fourth lead exit parts 225, 226 should preferably be disposed in the same way as the first and second lead exit parts 223, 224 so that the magnetic characteristics of the paths AA and BB described above that pass these exit parts are substantially equal.

Figure 46:
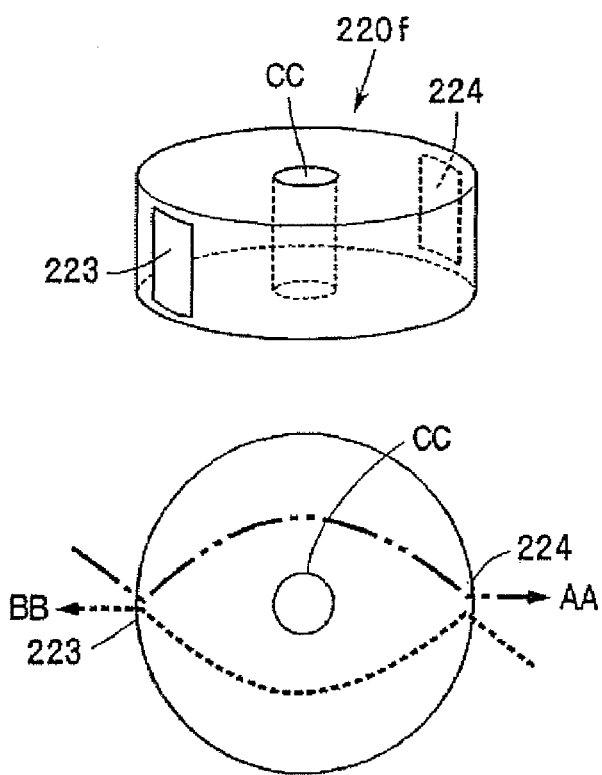
FIG. 46 is a perspective view and a plan view showing a sixth example of a pot-type magnetic core.
Figure 47:
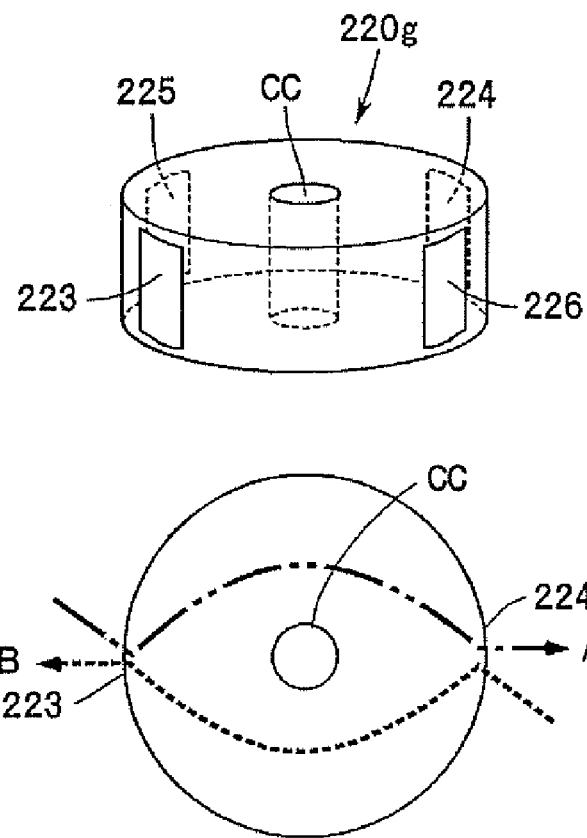
FIG. 47 is a perspective view and a plan view showing a seventh example of a pot-type magnetic core.

The pot-type magnetic core 220f shown in FIG. 46 is an example where the first lead exit part 223 and the second lead exit part 224 are formed as "windows" in the side surface of the core so that the magnetic characteristics of the paths AA, BB described above are substantially equal. The pot-type magnetic core 220g shown in FIG. 47 is an example where in addition to the window-shaped first and second lead exit parts 223, 224 of the pot-type magnetic core 220f shown in FIG. 46, third and fourth lead exit parts 225, 226 of the same window shapes have been added, so that there are a total of four lead exit parts. The third and fourth lead exit parts 225, 226 should preferably be disposed in the same way as the first and second lead exit parts 223, 224 so that the magnetic characteristics of the paths AA and BB described above that pass these exit parts are substantially equal.

Like the pot-type magnetic cores 220e to 220g shown in FIG. 45 to FIG. 47, when there are four lead exit parts, the signal input lead terminal 311 and the grounding lead terminal 321 are respectively led from a pair of first and second lead exit parts 223, 224 that are positioned so that the magnetic characteristics of the above paths AA and BB are substantially equal or a pair of the third and fourth lead exit parts 225, 226.

It should be noted that when the thickness of the circumferential wall of the pot-type magnetic core is uniform, to make the magnetic characteristics of the above paths AA, BB substantially equal, the first and second lead exit parts 223, 224 (or the third and fourth lead exit parts 225, 226) are disposed on a diameter line that passes the center core CC, but when the thickness of the core circumferential wall on the path AA side differs to the thickness of the core circumferential wall on the path BB side, the first and second lead exit parts 223, 224 are not necessarily disposed on a diameter line that passes the center core CC.

Figure 48A:
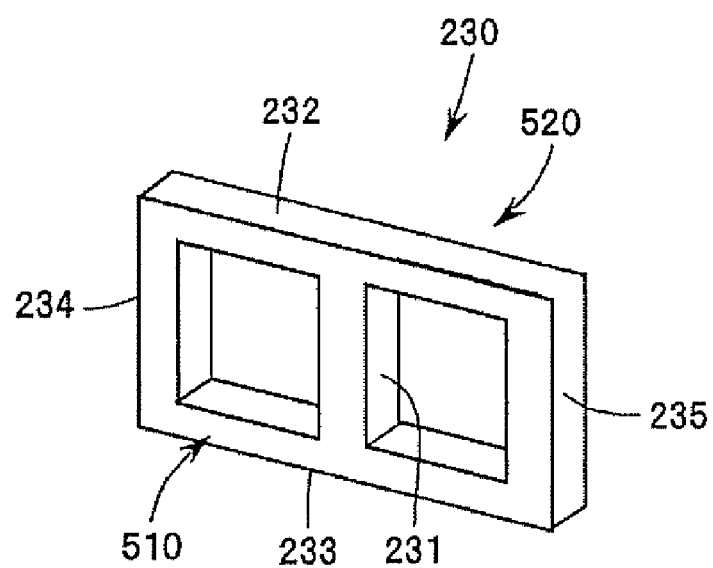
FIG. 48A is a perspective view showing a partitioned rectangular magnetic core.
Figure 48B:
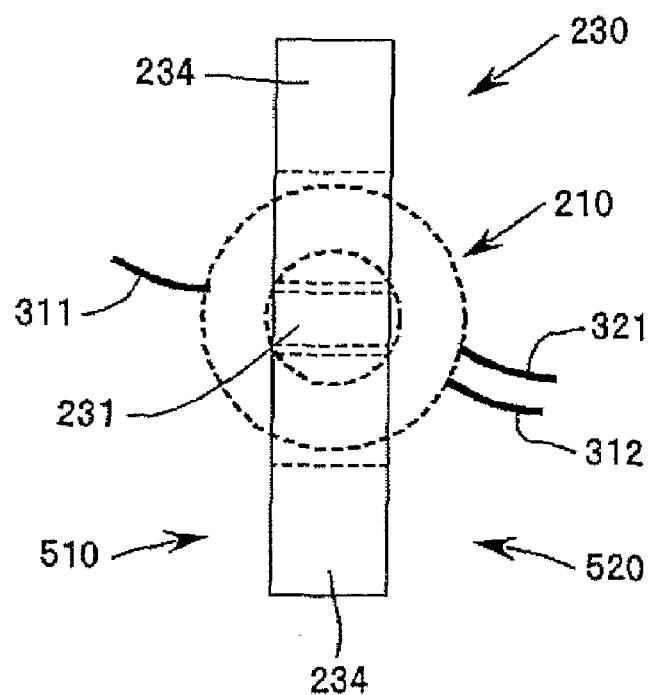
FIG. 48B is a plan view that schematically shows the partitioned rectangular magnetic core shown in FIG. 48A.

Next, the partitioned rectangular magnetic core 230 shown in FIG. 48A and 48B will be described. FIG. 48A is a perspective view of the magnetic core 230 and FIG. 48B is a plan view schematically showing a state where the coil 210 is attached to the magnetic core 230.

The magnetic core 230 includes a center core 231 that is passed through the center of the coil 210, an upper yoke 232 and a lower yoke 233 that are formed as an upper and lower pair and are respectively linked to the upper end and the lower end of the center core 231 and disposed in parallel along diameter lines of the coil 210, and a pair (left and right) of side yokes 234, 235 that are linked to both ends of the upper yoke 232 and the lower yoke 233.

The magnetic core 230 provides two magnetic circuits for the coil 210. One of these magnetic circuits is a first magnetic circuit including the center core 231, the left part of the upper yoke 232, the left side yoke 234, and the left part of the lower yoke 233, and the other magnetic circuit is a second magnetic circuit including the center core 231, the right part of the upper yoke 232, the right side yoke 235, and the right part of the lower yoke 233.

With this magnetic core 230, due to the magnetic circuits including the first and second magnetic circuits, both side surfaces of the same magnetic core 230 are spatially divided, so that one side surface (for example, the left side in FIG. 48B) is defined as a first lead exit part 510 and the other side surface (for example, the right side in FIG. 48B) is defined as a second lead exit part 520. That is, it is possible for the magnetic core 230 to include two independent lead exit parts 510, 520 in the same way as the pot-type magnetic core 220 described above.

Figure 49:
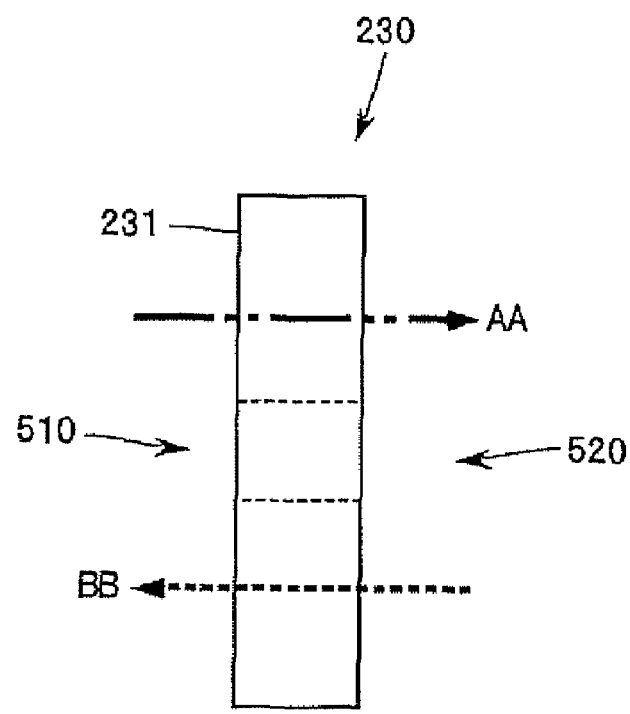
FIG. 49 is a schematic plan view useful in explaining the magnetic characteristics of the partitioned rectangular magnetic core.

The magnetic core 230 has left-right symmetry about the center of the center core 231, and as shown in FIG. 49, the magnetic characteristics of a path AA from one (the first) lead exit part 510 to another (the second) exit part 520 via an upper side of the center core 231 and an opposite path from the second lead exit part 520 to the first lead exit part 510 via a lower side of the center core 231 are substantially equal.

Accordingly, the partitioned rectangular magnetic core 230 also satisfies the first and second conditions, and when the signal input lead terminal 311 and the grounding lead terminal 321 are led as shown in FIG. 48B for example, if the signal input lead terminal 311 is led from the first lead exit part 510 the grounding lead terminal 321 will be led from the second lead exit part 520. It should be noted that the signal output lead terminal 312 may be led from either the first lead exit part 510 or the second lead exit part 520.

Figure 50A:
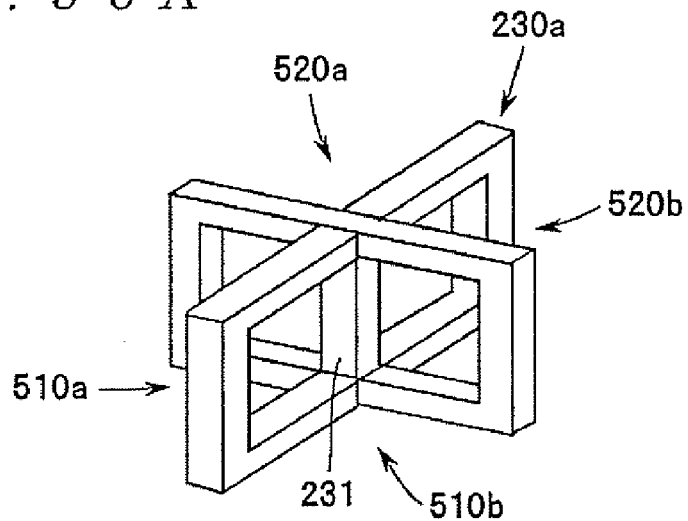
FIG. 50A is a perspective view showing a modification of the partitioned rectangular magnetic core.

As a modification, as shown in FIG. 50A, with a magnetic core 230a where two partitioned rectangular segmented cores have a shared center core 231 and are arranged so as to intersect in the shape of a cross, the first lead exit part 510 and the second lead exit part 520 are respectively divided into two so that four lead exit parts, the lead exit parts 510a, 510b and the lead exit parts 520a, 520b, are present.

For the present invention, the leading of the signal input lead terminal 311 and the grounding lead terminal 321 from two separate lead exit parts so that the magnetic characteristics of the paths AA and BB described above are substantially equal is an essential condition.

Figure 50B:
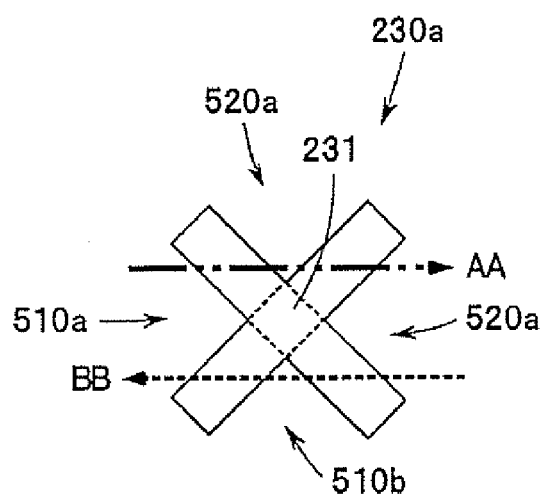
FIG. 50B is a schematic plan view useful in explaining the magnetic characteristics of the modified partitioned rectangular magnetic core shown in FIG. 50A.

This condition is satisfied, as shown in FIG. 50B, by both the pair of lead exit part 510a and the lead exit part 520b and the pair of lead exit part 510b and the lead exit part 520a that are 180° apart about the center core 231.

Accordingly, if the signal input lead terminal 311 is led from the first lead exit part 510a, for example, the grounding lead terminal 321 will be led from the lead exit part 520b positioned 180° apart from the first lead exit part 510a.

Figure 50C:
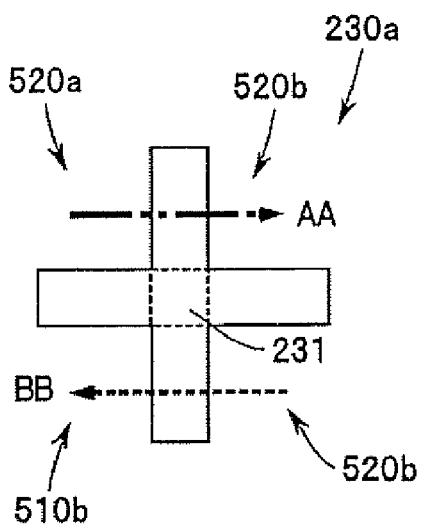
FIG. 50C is a schematic plan view useful in explaining the magnetic characteristics of the modified partitioned rectangular magnetic core shown in FIG. 50A.

As shown in FIG. 50C, when the signal input lead terminal 311 is led from the lead exit part 510a (or the lead exit part 510b), if the grounding lead terminal 321 were led from the lead exit part 520a (or the lead exit part 520b) that is adjacent to the lead exit part 510a, this would result in a lead exit part with different magnetic characteristics on the other side of the core being used, and so is prohibited for the present invention.

It should be noted that the magnetic core 220 is in reality a split core including an upper core 221 and a lower core 222 such as those shown in FIG. 34, and the partitioned rectangular magnetic core 230 is in reality also a split core. Accordingly, at the joined surface of the core, an air gap of around 100 μm for example, is present due to tolerance or the like. In some cases, a larger air gap is present between the parts of the split core.

When a magnetic circuit is not formed by this air gap, the two lead exit parts (for example, the lead exit part 510 and the lead exit part 520 for the magnetic core 230 described above) will be connected and the present invention will not be realized. For this reason, the permitted air gap width for the present invention is defined as follows.

Figure 51:
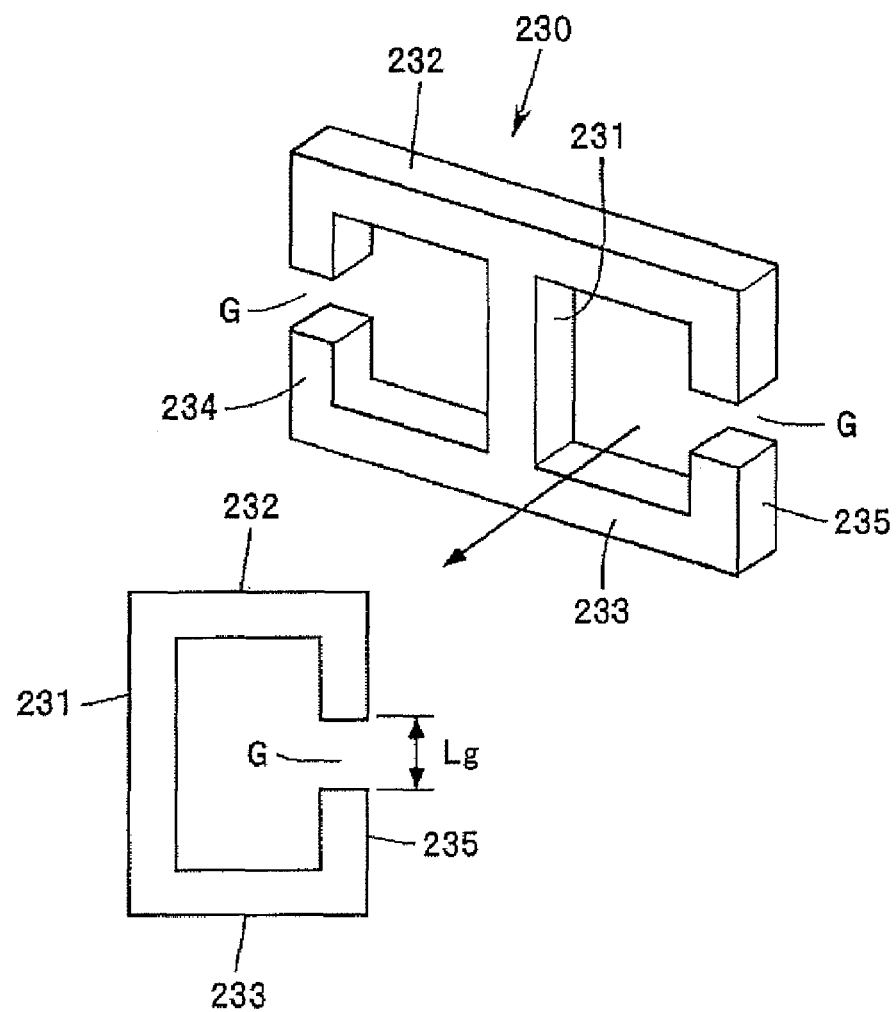
FIG. 51 is a diagram useful in explaining the definition of a magnetic circuit in the present invention.

Here, as shown in FIG. 51, it is assumed that air gaps G of the width Lg are present in the side yokes 234, 235 of the magnetic core 230 described above, for example. Here, if the inner circumferential length of one magnetic circuit included in the magnetic core 230 is expressed as Lin and the outer circumferential length is expressed as Lout, it is defined in the present invention that a magnetic circuit that interlinks the coil 210 is formed when the width Lg of the air gap G is less than ⅕ of the outer circumferential length Lout, that is, Lg<Lout/5.

In the present embodiment, an example of a normal mode noise filter with one signal transmission line 310 and one grounding line 320 has been described, but in the case of a common mode noise filter, there are cases where two or more signal transmission lines 310 and an equal number of grounding lines 320 are included.

Figure 52A:
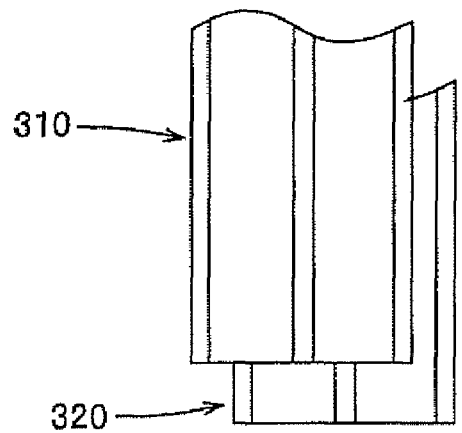
FIG. 52A is a schematic diagram showing an example of a common mode noise filter to which the present invention is applied.
Figure 52B:
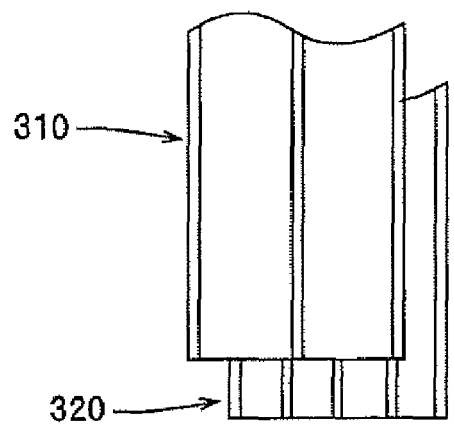
FIG. 52B is a schematic diagram showing another example of a common mode noise filter to which the present invention is applied.
Figure 52C:
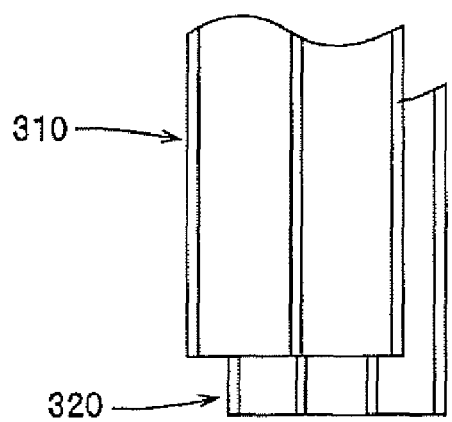
FIG. 52C is a schematic diagram showing another example of a common mode noise filter to which the present invention is applied.
Figure 52D:
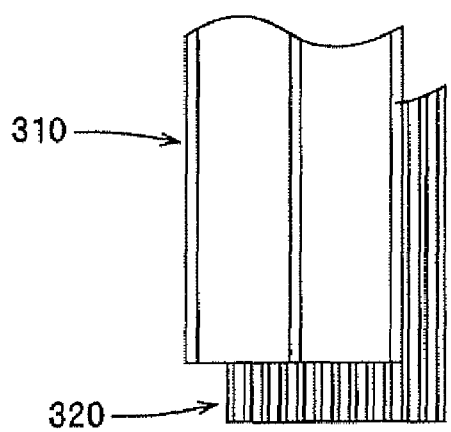
FIG. 52D is a schematic diagram showing another example of a common mode noise filter to which the present invention is applied.

In FIG. 52A, a dual signal transmission line-dual grounding line example where there are an equal number of signal transmission lines 310 and grounding lines 320 (as one example, two each) and each signal transmission line 310 is disposed so as to correspond to one grounding line 320 is shown. In FIG. 52B, a dual signal transmission line-quadruple grounding line example where there are two signal transmission lines 310 and four grounding lines 320 and each signal transmission line 310 is disposed so as to correspond to two grounding lines 320 is shown. In FIG. 52D, a dual signal transmission line-multiple grounding line example where there are two signal transmission lines 310 and twelve grounding lines 320 and each signal transmission line 310 is disposed so as to correspond to six grounding lines 320 is shown. In the examples shown in FIGS. 52A, 52B, and 52D, the respective grounding lines 320 should preferably be disposed in parallel so as to face the corresponding signal transmission line 310 and in addition, the signal transmission lines 310 should be formed narrower than the widths of the corresponding grounding lines 320 (in the case where there are a plurality of corresponding grounding lines 320, the entire width of the plurality of grounding lines 320) and should be disposed so as to be positioned within the widths of the corresponding grounding lines 320. It should be noted that as in a dual signal transmission line-partially coupled grounding line example shown in FIG. 52C, it is possible to use a construction where there are two signal transmission lines 310 and three grounding lines 320, with two of the grounding lines 320 (the two outer lines) being disposed so as to face only one signal transmission line 310 each and the remaining grounding line 320 (the middle line) being disposed so that half of the area of the line faces one of the signal transmission lines 310 and the other half of the area of the line faces the other of the signal transmission lines 310.

In this case, a signal input lead terminal 311 and a signal output lead terminal 312 are respectively connected to each signal transmission line 310, and as one example, the grounding lines 320 are split into predetermined groups and grounding lead terminals 321 are connected in group units. It should be noted that there are also cases where two signal input lead terminals 311 and two signal output lead terminals 312, for example, are connected to one signal transmission line 310.

When these lead terminals are led to the outside from the magnetic core, signal input lead terminals 311 (one or a group) and grounding lead terminals 321 (one or a group) that are electromagnetically coupled are selected and two independent lead exit parts 223, 224 (510, 520) are separately led to the outside of the magnetic core so that the magnetic characteristics will definitely be substantially equal in the same way as the embodiments described above. In the same way as the embodiments, there are no particular limitations on the signal output lead terminals 312 (one or a group).

Figure 53A:
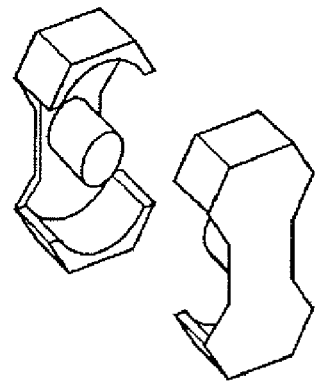
FIG. 53A is an exploded perspective diagram showing another example of a magnetic core applied to the above filter element.
Figure 53B:
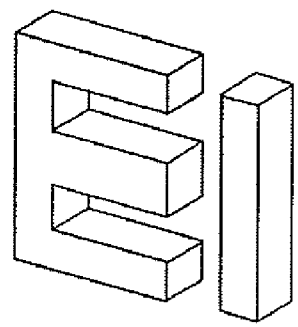
FIG. 53B is an exploded perspective diagram showing another example of a magnetic core applied to the above filter element.
Figure 53C:
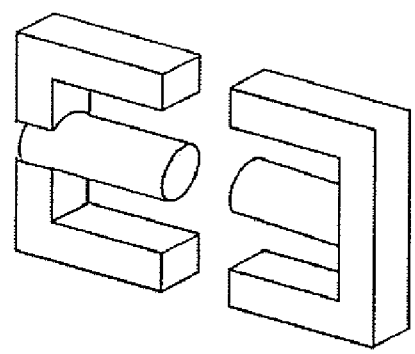
FIG. 53C is an exploded perspective diagram showing another example of a magnetic core applied to the above filter element.
Figure 53D:
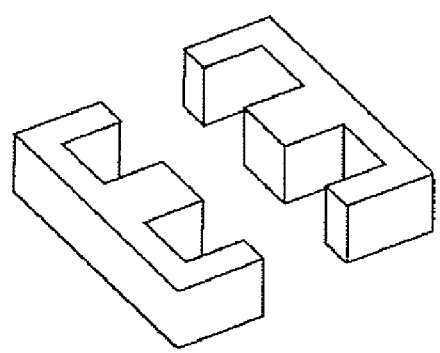
FIG. 53D is an exploded perspective diagram showing another example of a magnetic core applied to the above filter element.

It should be noted that aside from the magnetic cores shown in FIG. 41 to FIG. 50, an RM core shown in FIG. 53A, an EI core shown in FIG. 53B, an EER core shown in FIG. 53C, and an EE core shown in FIG. 53D are included in the "magnetic core" used for the filter element according to the present invention.

What is claimed is:

1. A filter element comprising:
   a coil part having a generally tubular shape comprising a layered pair of generally belt-shape signal transmitting conductors and a generally belt-shape grounding conductor with a generally belt-shape insulator in between and wound so that the belt-shape grounding conductor is outside the pair of belt-shape signal transmitting conductors;
   a magnetic body being attached to a center of the coil part;
   a pair of input terminals that are connected to respective outermost circumferential parts of the pair of belt-shape signal transmitting conductors and are respectively led from outer circumferential positions of the coil part;
   a pair of output terminals that are connected to respective innermost circumferential parts of the pair of belt-shape signal transmitting conductors and are respectively led from central positions of the coil part located on an opposite side to lead positions of the pair of input terminals with the magnetic body in between; and
   a grounding terminal that is connected to an outermost circumferential part of the belt-shape grounding conductor and is led from an outer circumferential position of the coil part located on an opposite side to the lead positions of the pair of input terminals with lead positions of the pair of output terminals in between, thereby providing superior attenuation characteristics.

2. A filter element comprising:
   a coil part having a generally tubular shape comprising a layered pair of generally belt-shape signal transmitting conductors and a generally belt-shape grounding conductor with a generally belt-shape insulator in between and wound so that the pair of belt-shape signal transmitting conductors are outside the belt-shape grounding conductor;
   a magnetic body being attached to a center of the coil part;
   a pair of input terminals that are connected to respective innermost circumferential parts of the pair of belt-shape signal transmitting conductors and are respectively led from central positions of the coil part;
   a grounding terminal that is connected to an innermost circumferential part of the belt-shape grounding conductor and is led from a central position of the coil part located on an opposite side to lead positions of the pair of input terminals with the magnetic body in between; and
   a pair of output terminals that are connected to respective outermost circumferential parts of the pair of belt-shape signal transmitting conductors and are respectively led from outer circumferential positions of the coil part located on an opposite side to the lead positions of the pair of input terminals with a lead position of the grounding terminal in between, thereby providing superior attenuation characteristics.

3. A filter element according to claim 1, wherein the lead position of the pair of input terminals, the lead position of the pair of output terminals, and the lead position of the grounding terminal are disposed on a single plane that includes a central axis of the coil part.

4. A filter element according to claim 2, wherein the position of the pair of input terminals, the position of the pair of output terminals, and the position of the grounding terminal are disposed on a single plane that includes a central axis of the coil part.

5. A filter element according to claim 1, wherein the respective belt-shape signal transmitting conductors are disposed in parallel on one surface of the belt-shape insulator so as to be separated from one another in a width direction of the belt-shape insulator, and the filter element includes at least as many generally belt-shape grounding conductors as generally belt-shape signal transmitting conductors and the belt-shape grounding conductors are disposed in parallel on another surface of the belt-shape insulator so as to be separated from one another in the width direction of the belt-shape insulator.

6. A filter element according to claim 2, wherein the respective belt-shape signal transmitting conductors are disposed in parallel on one surface of the belt-shape insulator so as to be separated from one another in a width direction of the belt-shape insulator, and the filter element includes at least as many generally belt-shape grounding conductors as generally belt-shape signal transmitting conductors and the belt-shape grounding conductors are disposed in parallel on another surface of the belt-shape insulator so as to be separated from one another in the width direction of the belt-shape insulator.

7. A filter element according to claim 3, wherein the respective belt-shape signal transmitting conductors are disposed in parallel on one surface of the belt-shape insulator so as to be separated from one another in a width direction of the belt-shape insulator, and the filter element includes at least as many generally belt-shape grounding conductors as generally belt-shape signal transmitting conductors and the belt-shape grounding conductors are disposed in parallel on another surface of the belt-shape insulator so as to be separated from one another in the width direction of the belt-shape insulator.

8. A filter element according to claim 4, wherein the respective belt-shape signal transmitting conductors are disposed in parallel on one surface of the belt-shape insulator so as to be separated from one another in a width direction of the belt-shape insulator, and the filter element includes at least as many generally belt-shape grounding conductors as signal transmitting conductors and the belt-shape grounding conductors are disposed in parallel on another surface of the belt-shape insulator so as to be separated from one another in the width direction of the belt-shape insulator.

9. A filter element according to claim 5, wherein the respective belt-shape grounding conductors correspond to the respective belt-shape signal transmitting conductors and a same number of the belt-shape grounding conductors are disposed in parallel with each generally belt-shape signal transmitting conductor.

10. A filter element according to claim 6, wherein the belt-shape respective grounding conductors correspond to the respective belt-shape signal transmitting conductors and a same number of the belt-shape grounding belt-like conductors are disposed in parallel with each generally belt-shape signal transmitting conductor.

11. A filter element according to claim 7, wherein the respective belt-shape grounding conductors correspond to the respective belt-shape signal transmitting conductors and a same number of the belt-shape grounding belt-like conductors are disposed in parallel with each generally belt-shape signal transmitting conductor.

12. A filter element according to claim 8, wherein the respective belt-shape grounding conductors correspond to the respective belt-shape signal transmitting conductors and a same number of the belt-shape grounding conductors are disposed in parallel with each generally belt-shape signal transmitting conductor.

13. A filter element according to claim 9, wherein the respective belt-shape signal transmitting conductors are disposed in parallel so as to face only the corresponding belt-shape grounding conductors.

14. A filter element according to claim 10, wherein the respective belt-shape signal transmitting conductors are disposed in parallel so as to face only the corresponding belt-shape grounding conductors.

15. A filter element according to claim 11, wherein the respective belt-shape signal transmitting conductors are disposed in parallel so as to face only the corresponding belt-shape grounding conductors.

16. A filter element according to claim 12, wherein the respective belt-shape signal transmitting conductors are disposed in parallel so as to face only the corresponding belt-shape grounding conductors.

17. A filter element according to claim 13, wherein the respective belt-shape signal transmitting conductors are formed so as to be narrower than the corresponding belt-shape grounding conductors and are disposed so as to be positioned within widths of the corresponding belt-shape grounding conductors.

18. A filter element according to claim 14, wherein the respective belt-shape signal transmitting conductors are formed so as to be narrower than the corresponding belt-shape grounding conductors and are disposed so as to be positioned within widths of the corresponding belt-shape grounding conductors.

19. A filter element according to claim 15, wherein the respective belt-shape signal transmitting conductors are formed so as to be narrower than the corresponding belt-shape grounding conductors and are disposed so as to be positioned within widths of the corresponding belt-shape grounding conductors.

20. A filter element according to claim 16, wherein the respective belt-shape signal transmitting conductors are formed so as to be narrower than the corresponding belt-shape grounding conductors and are disposed so as to be positioned within widths of the corresponding belt-shape grounding conductors.

* * * * *